US012349472B2

(12) United States Patent
Chowdhury et al.

(10) Patent No.: US 12,349,472 B2
(45) Date of Patent: Jul. 1, 2025

(54) SILICON NITRIDE WAVEGUIDE COUPLED PHOTODIODE

(71) Applicant: Rensselaer Polytechnic Institute, Troy, NY (US)

(72) Inventors: Asif Jahangir Chowdhury, Portland, OR (US); Mona Mostafa Hella, Watervliet, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 18/275,628

(22) PCT Filed: Dec. 3, 2021

(86) PCT No.: PCT/US2021/061759
§ 371 (c)(1),
(2) Date: Aug. 3, 2023

(87) PCT Pub. No.: WO2022/169501
PCT Pub. Date: Aug. 11, 2022

(65) Prior Publication Data
US 2024/0105875 A1 Mar. 28, 2024

Related U.S. Application Data

(60) Provisional application No. 63/145,014, filed on Feb. 3, 2021.

(51) Int. Cl.
*H01L 31/107* (2006.01)
*G02B 6/10* (2006.01)
(Continued)

(52) U.S. Cl.
CPC ......... *H10F 30/2255* (2025.01); *G02B 6/102* (2013.01); *H10F 71/1212* (2025.01);
(Continued)

(58) Field of Classification Search
CPC ........... H01L 31/1075; H01L 31/02327; H01L 31/03529; H01L 31/1808; G02B 6/102; G02B 2006/12176
See application file for complete search history.

(56) References Cited

U.S. PATENT DOCUMENTS 5,397,897 A 3/1995 Komatsu et al.
5,589,688 A 12/1996 Kimura et al.
(Continued)

FOREIGN PATENT DOCUMENTS

CN 103380500 A 10/2013
CN 104865223 A 8/2015
(Continued)

OTHER PUBLICATIONS

International Search Report and The Written Opinion of the International Searching Authority, International Application No. PCT/US2021/061759, mailed May 3, 2022.

*Primary Examiner* — Samuel A Gebremariam
(74) *Attorney, Agent, or Firm* — Barclay Damon LLP; Anthony P. Gangemi

(57) ABSTRACT

A photodiode structure including a silicon substrate, an oxide layer on the silicon substrate, a silicon on insulator region on the oxide layer, a germanium absorption region, a silicon nitride waveguide, a cathode region, and an anode region is provided. The germanium absorption region is at least partially disposed in a recess of the silicon on insulator region. The germanium absorption region includes a top surface having a first width and a bottom surface having a second width, the first width being greater than the second width. The cathode region is formed at a first side of the germanium absorption region, and the anode region is formed at a second side of the germanium absorption region that is opposite the first side.

20 Claims, 17 Drawing Sheets

(51) Int. Cl.
  *H10F 30/225*    (2025.01)
  *H10F 71/00*     (2025.01)
  *H10F 77/14*     (2025.01)
  *H10F 77/40*     (2025.01)
  *G02B 6/12*      (2006.01)

(52) U.S. Cl.
  CPC ......... *H10F 77/148* (2025.01); *H10F 77/413* (2025.01); *G02B 2006/12176* (2013.01)

(56) References Cited

U.S. PATENT DOCUMENTS

| | | |
|---|---|---|
| 5,962,854 A | 10/1999 | Endo |
| 7,180,066 B2 | 2/2007 | Qiu |
| 7,262,404 B2 | 8/2007 | Yamaguchi et al. |
| 7,655,909 B2 | 2/2010 | Schimert et al. |
| 7,663,106 B2 | 2/2010 | Ushimi et al. |
| 8,350,301 B2 | 1/2013 | Miura et al. |
| 8,786,043 B2 | 7/2014 | Huang et al. |
| 8,861,909 B2 | 10/2014 | Lipson et al. |
| 9,024,402 B2 | 5/2015 | Kang et al. |
| 9,082,673 B2 | 7/2015 | Yu et al. |
| 9,224,882 B2 | 12/2015 | Na et al. |
| 9,389,125 B2 | 7/2016 | Yon et al. |
| 9,391,225 B1 | 7/2016 | Davids et al. |
| 9,513,436 B2 | 12/2016 | Czornomaz et al. |
| 9,525,084 B2 | 12/2016 | Wang et al. |
| 9,645,045 B2 | 5/2017 | Norwood et al. |
| 9,704,916 B2 | 7/2017 | Cheng et al. |
| 9,728,657 B2 | 8/2017 | Joo et al. |
| 9,748,429 B1 | 8/2017 | Davids et al. |
| 9,755,096 B2 | 9/2017 | Novack et al. |
| 9,761,746 B2 | 9/2017 | Kang et al. |
| 9,780,248 B2 | 10/2017 | Huang et al. |
| 9,917,650 B2 | 3/2018 | Liboiron-Ladouceur et al. |
| 10,468,543 B2 | 11/2019 | Wang et al. |
| 10,529,878 B1 | 1/2020 | Baehr-Jones et al. |
| 10,529,886 B2 | 1/2020 | Cheng et al. |
| 2004/0170110 A1 | 9/2004 | Yee |
| 2010/0278694 A1 | 11/2010 | Huh et al. |
| 2012/0213245 A1 | 8/2012 | Noda |
| 2016/0327743 A1 | 11/2016 | Kippenberg et al. |

FOREIGN PATENT DOCUMENTS

| | | |
|---|---|---|
| CN | 109148619 A | 1/2019 |
| EP | 3306678 A1 | 4/2018 |
| GB | 2562481 A | 11/2018 |
| GB | 2563278 A | 12/2018 |
| WO | 2009075435 A1 | 6/2009 |
| WO | 2010055750 A1 | 5/2010 |
| WO | 2014190189 A2 | 11/2014 |
| WO | 2020096950 A1 | 5/2020 |

SILICON NITRIDE WAVEGUIDE COUPLED PHOTODIODE

CROSS REFERENCE TO RELATED APPLICATION(S)

This application is a U.S. National Stage Application of, and claims the priority benefit of, International Patent Application No. PCT/US2021/061759, filed Dec. 3, 2021, which claims the priority benefit of U.S. Provisional Patent Application No. 63/145,014, filed Feb. 3, 2021, the contents of which are incorporated by reference as if disclosed herein in their entireties.

STATEMENT REGARDING FEDERALLY SPONSORED RESEARCH AND DEVELOPMENT

The present invention was made with government support under Grant No. DE-AR0000942 awarded by the United Stated Department of Energy. The government has certain rights in the invention.

FIELD

The present technology generally relates to the area of photodiodes. More particularly, the present technology relates to silicon nitride waveguide coupled photodiode structures having improved efficiency for the wavelength range of 850 nm to 940 nm.

BACKGROUND

The silicon photonics area has seen a tremendous boost over the past two decades because of the relentless research initiative taken by the energetic research community. Diverse applications such as optical data and telecommunication links, bio sensing, LiDAR, smart phone, healthcare, and space communication require integration of photonics and electronics systems to meet different system level specifications. Complementary Metal Oxide Semiconductor ("CMOS") silicon only photodetectors have shown promising results at 850 nm wavelength in recent years, but they fall short at 940 nm wavelength.

To improve the responsivity at longer wavelengths, recent solution-attempts have been proposed in silicon, such as back side illumination, grating assisted photodetector, and photon trapping absorbance enhancement. However, these solutions are either challenging in terms of seamless integration into commercial process or require significant custom process modifications. Germanium on Silicon photodetectors offer the best solution for the optical communication bands in terms of CMOS compatibility and cost effectiveness. To date, the majority of research efforts have been on optimization of Ge-on-Si photodetectors suitable for telecommunication bands such as O (1260-1360 nm), S (1460-1530 nm), C (1530-1565 nm), and L (1565-1625 nm). With the advent of emerging technologies driven by low cost vertical-cavity surface-emitting lasers ("VCSEL") and eye safety issues, such as shortwave wavelength division multiplex ("SWDM"), automotive LiDAR, etc., the wavelength range of 850 nm to 940 nm is also attracting a lot of interest recently. However, current Ge-on-Si photodetector structures are not suitable for the wavelength range of 850 nm to 940 nm, due to the high absorption of Silicon.

Thus, a need exists for an improved photodetector that addresses the foregoing problems.

SUMMARY

According to an exemplary embodiment of the present technology, a photodiode structure including a silicon substrate, an oxide layer on the silicon substrate, a silicon on insulator region on the oxide layer, a germanium absorption region, a silicon nitride waveguide, a cathode region, and an anode region is provided. The germanium absorption region is at least partially disposed in a recess of the silicon on insulator region. The germanium absorption region includes a top surface having a first width and a bottom surface having a second width, the first width being greater than the second width. The cathode region is formed at a first side of the germanium absorption region, and the anode region is formed at a second side of the germanium absorption region that is opposite the first side.

In some embodiments, the germanium absorption region further includes a bottom portion that conforms in shape to a shape of the recess of the silicon on insulator region.

In some embodiments, the bottom portion of the germanium absorption region has trapezoidal cross-section, and the germanium absorption regions further includes a top portion having a rectangular cross-section.

In some embodiments, the anode region, the cathode region, and the germanium absorption region form a PIN photodiode.

In some embodiments, the photodiode structure further includes a charge region adjacent to the germanium absorption region, and an intrinsic multiplication region adjacent to the charge region such that the cathode region is adjacent to the intrinsic multiplication region.

In some embodiments, the anode region, the cathode region, the charge region, the intrinsic multiplication region, and the germanium absorption region form a separate absorption, charge and multiplication avalanche photodiode.

In some embodiments, the silicon nitride waveguide is positioned over the anode region, the cathode region, or both the anode region and the cathode region.

In some embodiments, the photodiode structure further includes cathode electrical contacts positioned on an extended silicon on insulator region.

In some embodiments, the photodiode structure further includes anode electrical contacts positioned on an extended silicon on insulator region.

In some embodiments, the photodiode structure further includes N type doping positioned under the silicon nitride waveguide.

In some embodiments, the photodiode structure further includes P type doping positioned under the silicon nitride waveguide.

In some embodiments, the photodiode structure further includes a metal reflector positioned above the germanium absorption region to enhance light coupling efficiency.

According to another exemplary embodiment of the present technology, a method of forming a photodiode is provided. The method includes the steps of: providing a silicon substrate; depositing silicon dioxide on the silicon substrate to form a bottom oxide layer; forming a thin silicon on insulator layer on a portion of the bottom oxide layer; epitaxially growing a germanium absorption region on the silicon on insulator layer such that the germanium absorption region is at least partially disposed in a recess of the silicon on insulator layer, the germanium absorption region including a top surface having a first width and a bottom surface having a second width, the first width being greater than the second width; implanting N type doped regions in the bottom oxide layer adjacent a first side of the germanium absorption region; implanting P type doped regions in the bottom oxide layers adjacent a second side of the germanium absorption region; fabricating a nitride waveguide adjacent to the germanium absorption region; and forming anode and cathode contacts.

In some embodiments, the germanium absorption region further includes a bottom portion that conforms in shape to a shape of the recess of the silicon on insulator region.

In some embodiments, the bottom portion of the germanium absorption region has trapezoidal cross-section, and the germanium absorption regions further comprises a top portion having a rectangular cross-section.

In some embodiments, before the step of epitaxially growing, the method further includes the steps of: forming a charge region adjacent to the silicon on insulator layer; and forming an intrinsic multiplication region adjacent to the charge region such that the charge region is located between the intrinsic multiplication region and the silicon on insulator layer.

In some embodiments, the step of implanting N type doped regions includes: implanting an N+ type doped region in the bottom oxide layer adjacent a first side of the germanium absorption region; and implanting an N++ type doped region in the bottom oxide layer adjacent an end of the N+ type doped region; wherein the N+ type doped region has a length greater than a length of the germanium absorption region and is positioned such that the N++ type doped region is offset from a first end of the germanium absorption region.

In some embodiments, the step of implanting P type doped regions includes: implanting a P+ type doped region in the bottom oxide layer adjacent a second side of the germanium absorption region; and implanting a P++ type doped region in the bottom oxide layer adjacent an end of the P+ type doped region; wherein the P+ type doped region has a length greater than a length of the germanium absorption region and is positioned such that the P++ type doped region is offset from a second end of the germanium absorption region.

In some embodiments, the anode contacts are formed in the P++ type doped region and the cathode contacts are formed in the N++ type doped region.

In some embodiments, the nitride waveguide is fabricated via selective etching and either plasma enhanced chemical vapor deposition or low-pressure chemical vapor deposition.

Further objects, aspects, features, and embodiments of the present technology will be apparent from the drawing figures and below description.

DETAILED DESCRIPTION

Figure 1:
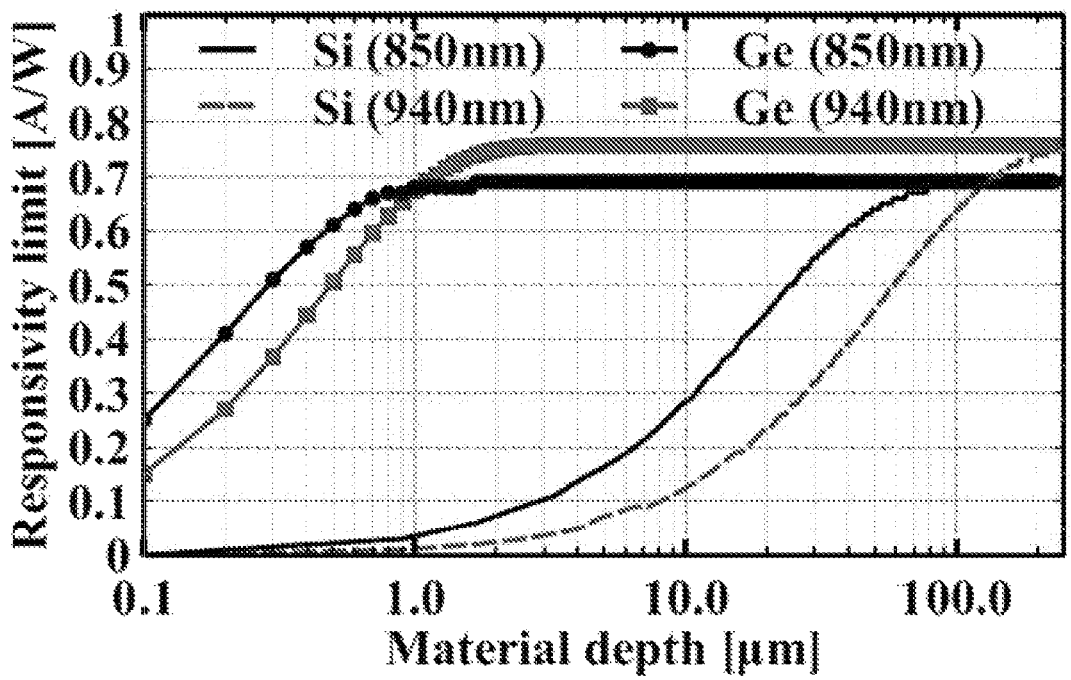
FIG. 1 is a chart showing the responsivity limits for various depths in silicon and germanium.

Accordingly, embodiments of the present technology are directed to a silicon nitride waveguide coupled Ge-on-Si photodiode that is configured to operate at higher responsivity in the 850 nm to 940 nm wavelength range. The responsivity ("R") in a semiconductor material can be calculated as:

$$R = \frac{\lambda}{1.24}\eta_c(1-r)(1-e^{-\alpha W}) \quad (1)$$

where λ is the wavelength in μm, $\eta_c$ is the optical coupling efficiency of the detector, r is the reflectivity, α is the absorption coefficient of the material for the specified wavelength, and W is the width of the device. The absorption coefficient for Germanium is 2.2 μm$^{-1}$ at 940 nm and 4.5 μm$^{-1}$ at 850 nm, and for Silicon it is 0.0183 μm$^{-1}$ at 940 nm and 0.0535 μm$^{-1}$ at 850 nm wavelength. FIG. 1 shows the dependence of the theoretical limit of responsivity for Ge and Si for various depth at 100% coupling efficiency for 850 nm and 940 nm. At 850 nm the required width for maximum responsivity for silicon is 70 μm, whereas for germanium it is 1.7 µm. At 940 nm for silicon it is 220 µm, whereas for germanium it is 2.6 µm. Thus, embodiments of the present technology use a longer and wider device in silicon to implement a photodetector compared to Germanium at 850 nm and 940 nm wavelength.

In some embodiments, the photodiode includes CMOS-compatible silicon nitride ("$Si_3N_4$"). The major advantage of $Si_3N_4$ is it does not suffer from two-photon and free-carrier absorption over the telecommunication wavelength ranges. Its lowest-order nonlinear susceptibility is about 20 times smaller than that of Si, which means SiN waveguides can handle higher optical powers than Si waveguides. SiN photonic components are also less temperature-sensitive owing to a thermo-optic coefficient that is about five times smaller than that of Si. The lower index contrast of $Si_3N_4$ (n 2) waveguides with silica (($SiO_2$), n≈1.45) cladding compared to Si (n≈3.48) waveguides also reduces the waveguide losses due to sidewall roughness scattering, dispersion, and sensitivity to variations in waveguide dimensions. The optical transparency of $Si_3N_4$ is high in the near-infrared and visible wavelength range, making it suitable for non-telecommunication applications, such as biosensors and frequency combs. Because of these optical properties and the necessity of higher responsivity at 940 nm wavelength, embodiments of the present technology include nitride coupled PIN photodiode structures and Avalanche photodiode structures, as described in detail below.

Figure 2A:
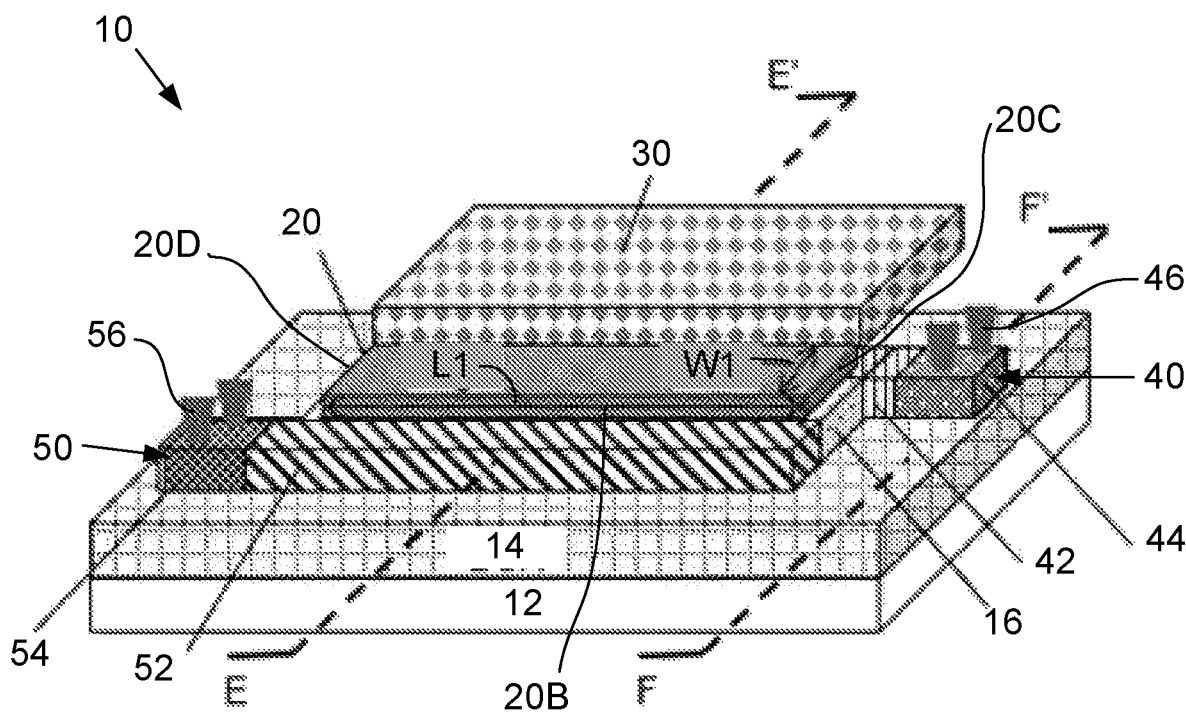
FIG. 2A is a perspective view of a nitride waveguide coupled PIN photodetector according to an exemplary embodiment of the present technology.

FIG. 2A shows a perspective view of a nitride waveguide coupled photodiode 10 according to an exemplary embodiment of the present technology. In the embodiment shown, the photodiode 10 is a PIN photodiode. The photodiode 10 includes a silicon substrate 12, a bottom oxide layer ("BOX") 14 formed on the silicon substrate 12, and a silicon on insulator region ("SOI") 16 formed over portions of the BOX 14. A germanium absorption region 20 is grown over at least a portion of the SOI 16. A nitride waveguide 30 is coupled to the photodiode 10 adjacent the germanium absorption region 20. In some embodiments, the nitride waveguide 30 is formed of silicon nitride. In some embodiments, a nitride grating coupler directs the input optical signal to the germanium absorption region 20 via the silicon nitride waveguide 30 in two ways: 1) butt coupling via direct interfacing of germanium absorption region 20 and silicon nitride waveguide 30, and 2) evanescent coupling via the portion of the SOI 16 positioned under the nitride waveguide 30. The silicon nitride waveguide layer 30 is preferably formed by selective etching and either using plasma-enhanced chemical vapor deposition ("PECVD") or low-pressure chemical vapor deposition ("LPCVD") process. The length L1 and first width W1 of the germanium absorption region 20 are determined by various specifications such as dark current, responsivity, the operating wavelength, and the dimensions of the silicon nitride photonic elements such as the waveguide 30 and edge/grating coupler. In some embodiments, the thickness of the nitride waveguide 30 is in the wavelength range of 200 nm to 1000 nm, and preferably, less than 500 nm. The germanium absorption region 20 is grown in a recess 18 in the SOI 16 using a selective epitaxy growth technique.

Figure 2B:
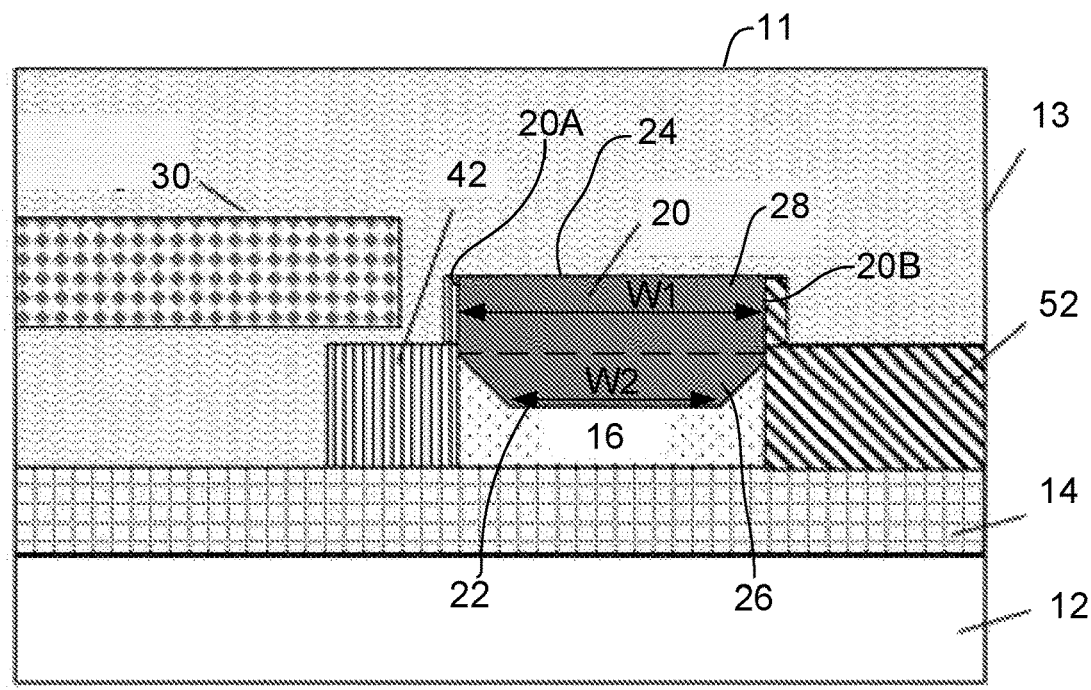
FIG. 2B is a cross-section view of the photodetector of FIG. 2A taken along section line E-E'.

In some embodiments, the photodiode 10 includes a cathode region 40. The cathode region 40 includes an N+ doped SOI region 42 adjacent to a first side 20A of the germanium absorption region 20, and an N++ doped extended SOI region 44 positioned outside the waveguide area for ohmic contact formation. In some embodiments, the N+ doped SOI region 42 is positioned under the silicon nitride waveguide 30. In some embodiments, the N+ doped SOI region 42 has a length greater than the length L1 of the germanium absorption region 20 and is positioned such that the N++ doped extended SOI region 44 is offset from a first end 20C of the germanium absorption region 20. In some embodiments, the photodiode 10 includes an anode region 50. The anode region 50 includes a P+ doped SOI region 52 adjacent to a second side 20B of the germanium absorption region 20 opposite the first side 20A, and a P++ doped extended SOI region 54 for ohmic contact formation on the second side of the germanium region 20 relative to the waveguide 30 forming a lateral PIN photodetector. In some embodiments, the P+ doped SOI region 52 has a length greater than the length L1 of the germanium absorption region 20 and is positioned such that the P++ doped extended SOI region 54 is offset from a second end 20D of the germanium absorption region 20. FIG. 2B shows a cross-section of the PIN photodiode 10 along the section line E-E' shown in FIG. 2A.

As shown in FIG. 2B, in some embodiments, the cathode region 40 includes only the N+ doped SOI region 42 and no cathode contacts 46 formed therein, as it is not preferred to form the cathode contacts 46 on top of the N+ doped SOI region 42 when it is positioned under the silicon nitride waveguide 30. However, the N+ doping SOI region 42 is formed, in some embodiments, as the implantation process is performed before formation of the nitride waveguide 30. The cathode contacts 46 are placed outside the waveguide region on the N++ doped extended SOI region 44, as shown in FIG. 2A. In the anode region 50, the anode contacts 56 are placed on the P+ doped SOI region 52 directly or on the P++ doped extended SOI region 54, like the cathode region 40 for device symmetry. However, the present technology contemplates various asymmetrical cathode-anode structures for coupling light simultaneously from the two-opposing sides of the germanium absorption region 20.

As shown in FIG. 2B, the germanium absorption region 20 is grown in a recess 18 in the SOI 16 such that the bottom surface 22 of the germanium absorption region 20 conforms in shape to the recess 18. In some embodiments, the germanium absorption region 20 has a second width W2 at the bottom surface 22 that is less than the first width W1 at the top surface 24 thereof. In some embodiments, the germanium absorption region 20 has chamfered edges adjacent the bottom surface 22 such that a bottom portion 26 of the germanium absorption region 20 has a trapezoidal cross-section, and a top portion 28 of the germanium absorption region 20 has a rectangular cross-section, as shown in FIG. 2B. However, the present technology contemplates the recess 18 and bottom surface 22 having different shapes such that the bottom portion 26 has different cross-sections, including but not limited to triangular, semi-circular, semi-ellipsoidal, etc. cross-sections.

Figure 2C:
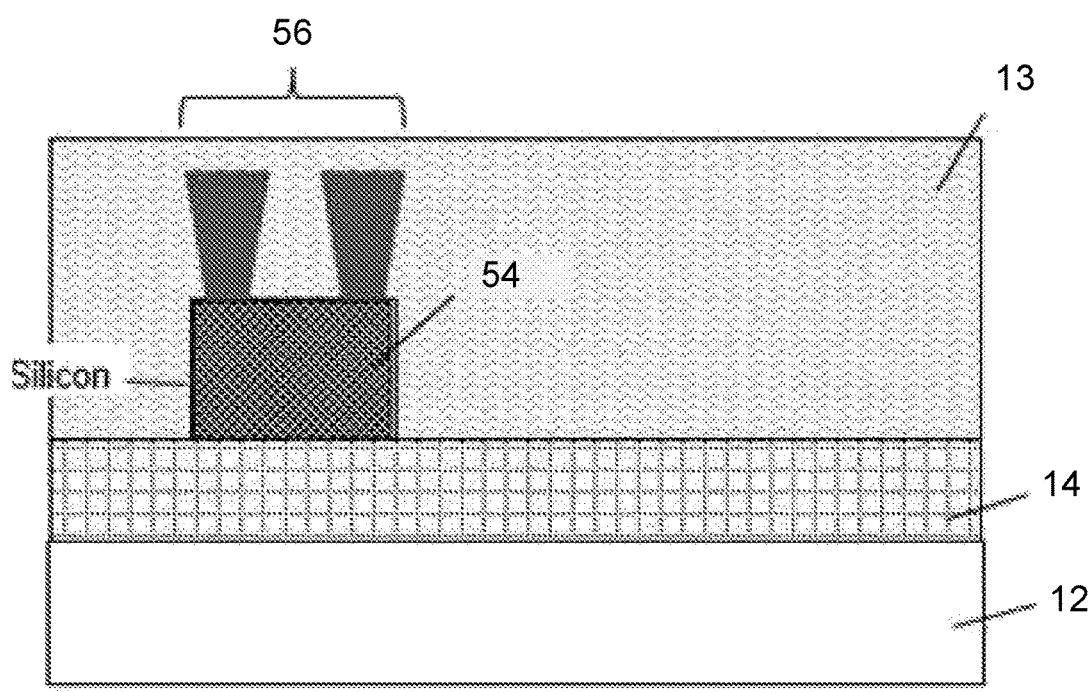
FIG. 2C is a cross-section view of the photodetector of FIG. 2A taken along section line F-F'.
Figure 2D:
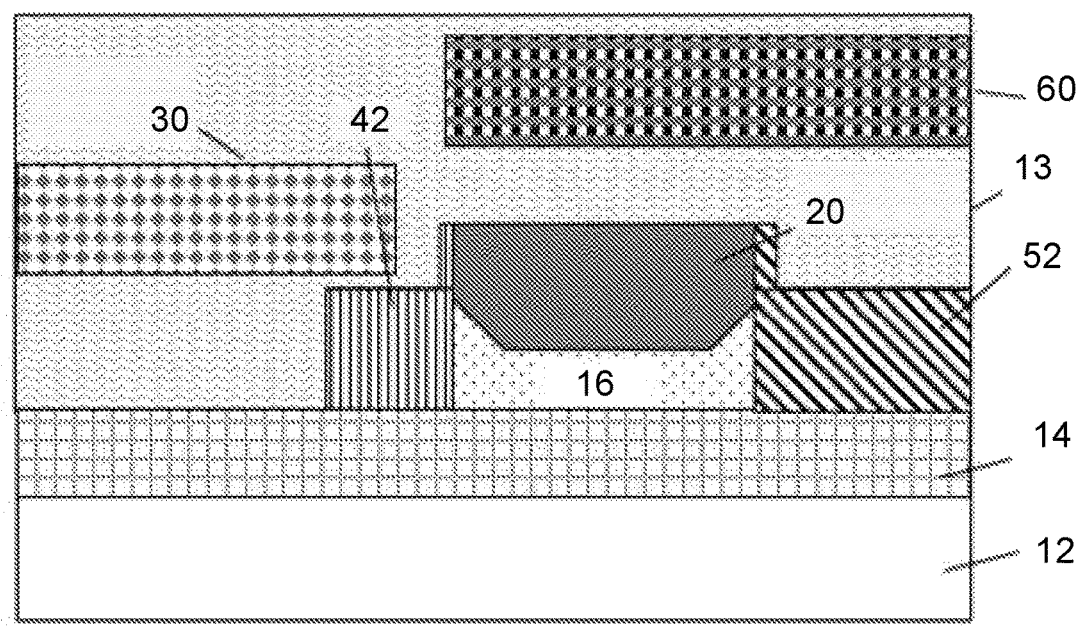
FIG. 2D is the cross-section view of FIG. 2B showing a metal reflector coupled to the photodetector.

FIG. 2C shows a cross-section along section line F-F' of FIG. 2A. As shown in FIG. 2C, the P++ doped extended SOI region 54 is implemented, in some embodiments, in an isolated fashion enabling nitride waveguide integration and contact formation. The top region 11 of the photodiode 10 is filled with additional dielectric material 13 to enable electric cathode contacts 46, electric anode contacts 56, surface passivation, and device protection. In some embodiments, metal contact used for the electrical pads (not shown) is used as a metal reflector 60, as shown in FIG. 2D.

Figure 3A:
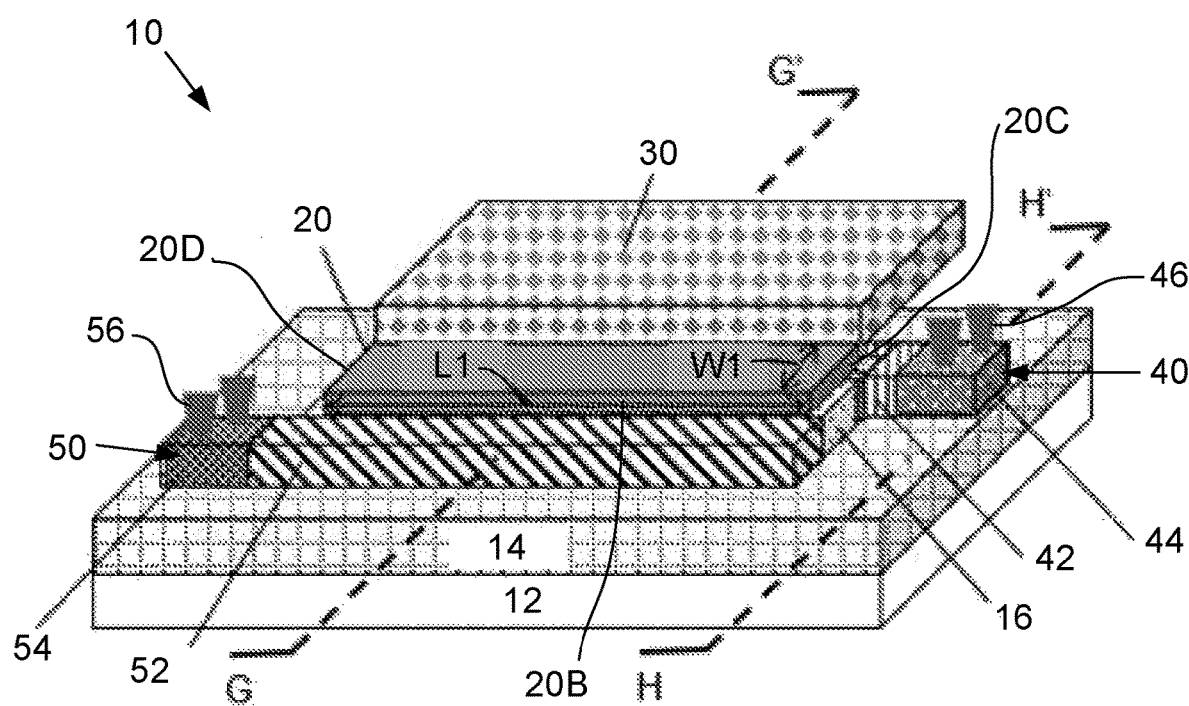
FIG. 3A is a perspective view of a nitride waveguide coupled SACM avalanche photodetector according to an exemplary embodiment of the present technology.

FIG. 3A shows a perspective view of a nitride waveguide coupled photodiode 10 according to another exemplar embodiment of the present technology. As shown, the photodiode 10 is a separate absorption, charge and multiplication ("SACM") avalanche photodiode ("APD"). The SACM APD 10 has the features and is formed in the same manner as the PIN photodiode 10 presented above, but the SACM APD 10 includes an additional P doped region 70 between the germanium absorption region 20 and the N+ doped SOI region 42, which forms the charge layer 72 for implementing an avalanche photodiode. In some embodiments, the additional P doped region 70 includes a multiplication region 74 positioned between the charge layer 72 and the N+ doped SOI region 42. The SACM APD 10 structure shown is beneficial for at least the following reasons: (1) no contact is necessary on top of Ge, which has a degrading impact on the responsivity of the photodiode; and (2) the implementation is more efficient for a commercial multi-project wafer semiconductors.

Figure 3B:
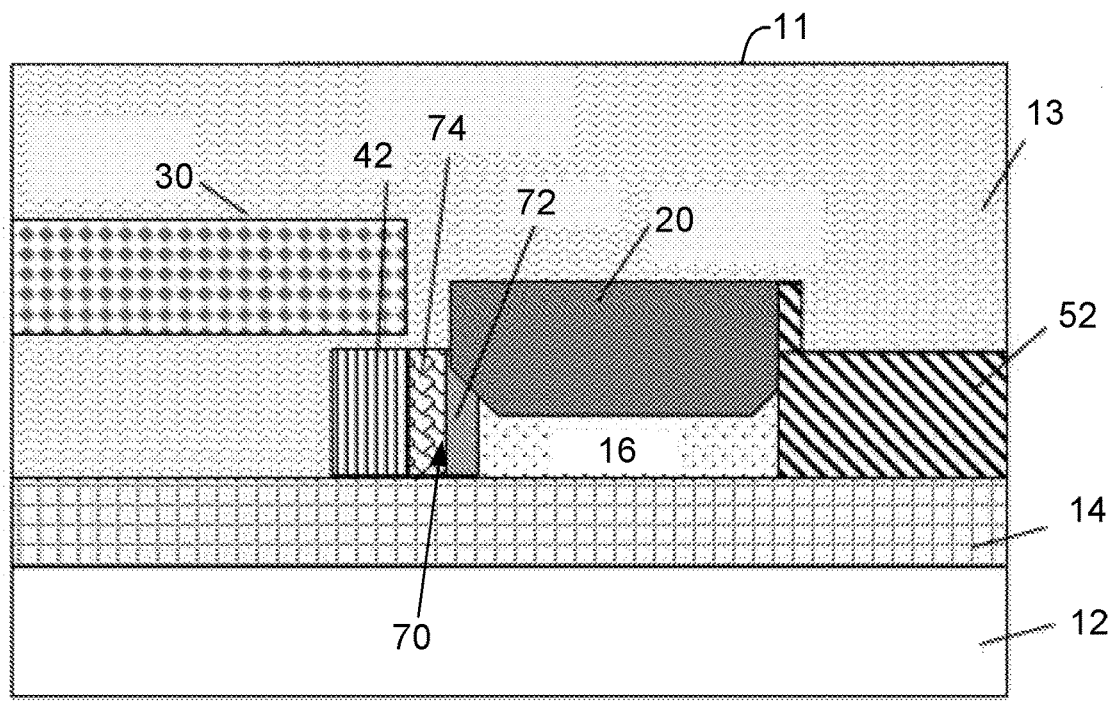
FIG. 3B is a cross-section view of the photodetector of FIG. 3A taken along section line G-G'.

FIG. 3B shows a cross-section of the silicon nitride waveguide butt coupled Ge-on-Si APD 10 along section line G-G' shown in FIG. 3A. In some embodiments, switching the position of the anode region 50 and the cathode region 40 reduces the responsivity of the APD 10, unlike the PIN photodiode 10. This shifts the charge region 72 farther away from the interface between the nitride waveguide 30 and germanium absorption region 20, where the photon absorption rate is high. Due to the low electric field in the center of the germanium absorption region 20, most of the electron-hole pairs generated are not effectively collected, and hence the responsivity of the device reduces due to recombination, and bandwidth is reduced due to diffusion of the free carriers generated by photon absorption.

Figure 3C:
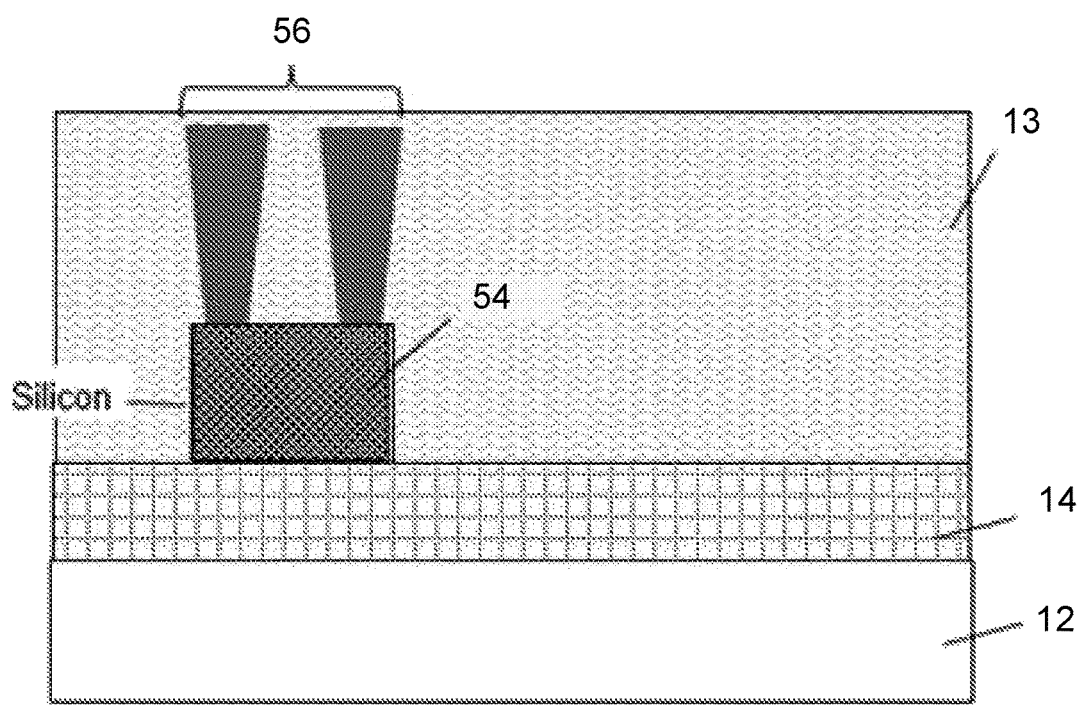
FIG. 3C is a cross-section view of the photodetector of FIG. 3A taken along section line H-H'.

FIG. 3C shows a cross-section along section line H-H' of FIG. 3A. As shown in FIG. 3C, the P++ doped extended SOI region 54 is implemented, in some embodiments, in an isolated fashion enabling nitride waveguide integration and contact formation. The top region 11 of the photodiode 10 is filled with additional dielectric material 13 to enable electric cathode contacts 46, electric anode contacts 56, surface passivation, and device protection. In some embodiments, metal contact used for the electrical pads (not shown) is used as a metal reflector 60, as shown in FIG. 3D.

Figure 3D:
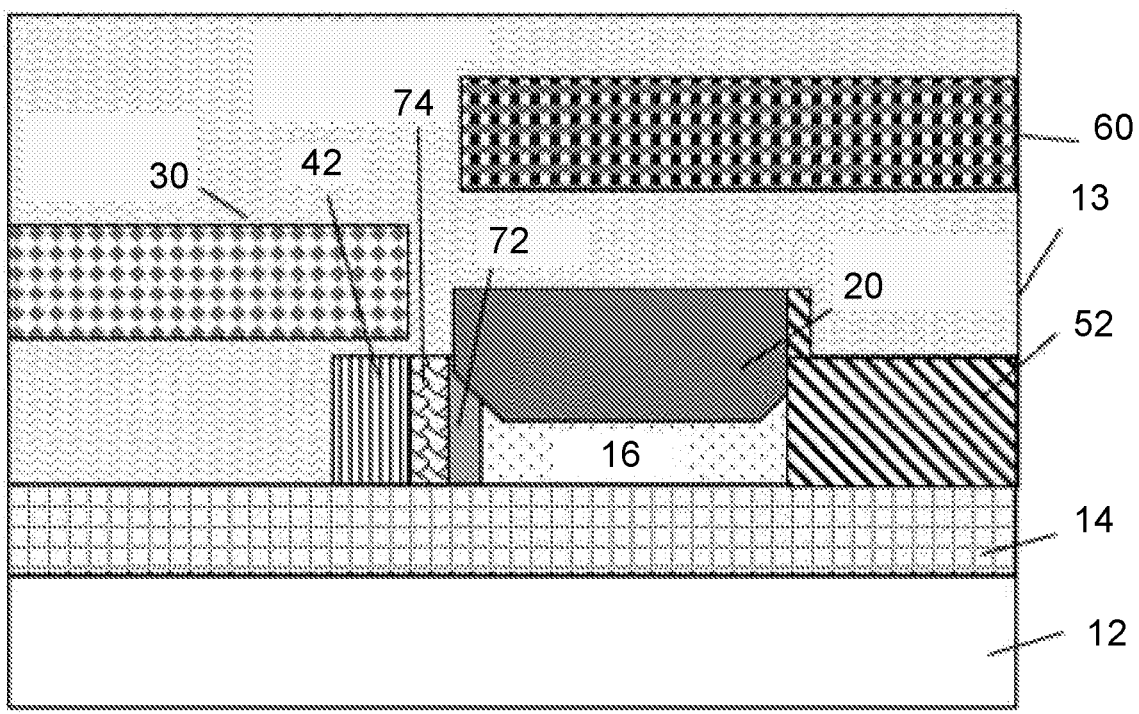
FIG. 3D is the cross-section view of FIG. 3B showing a metal reflector coupled to the photodetector.

FIG. 2D shows another exemplary embodiment of the PIN photodetector 10, and FIG. 3D shows another exemplary embodiment of the SACM APD 10, with a metal reflector 60 on top of the germanium absorption region 20. Metal contact used for the electrical pads can also be utilized in two ways. First, it works as a reflector enhancing the coupling efficiency of nitride to germanium light collection. In some embodiments, the coupling efficiency is defined as the ratio of absorbed power density in the germanium region and the input optical power density at the interface between grating or edge coupler and silicon nitride waveguide 30. Second, it blocks any light from the top surface 15 of the photodiode 10, thereby ensuring the input signal is coupled from the nitride waveguide only.

Figure 4:
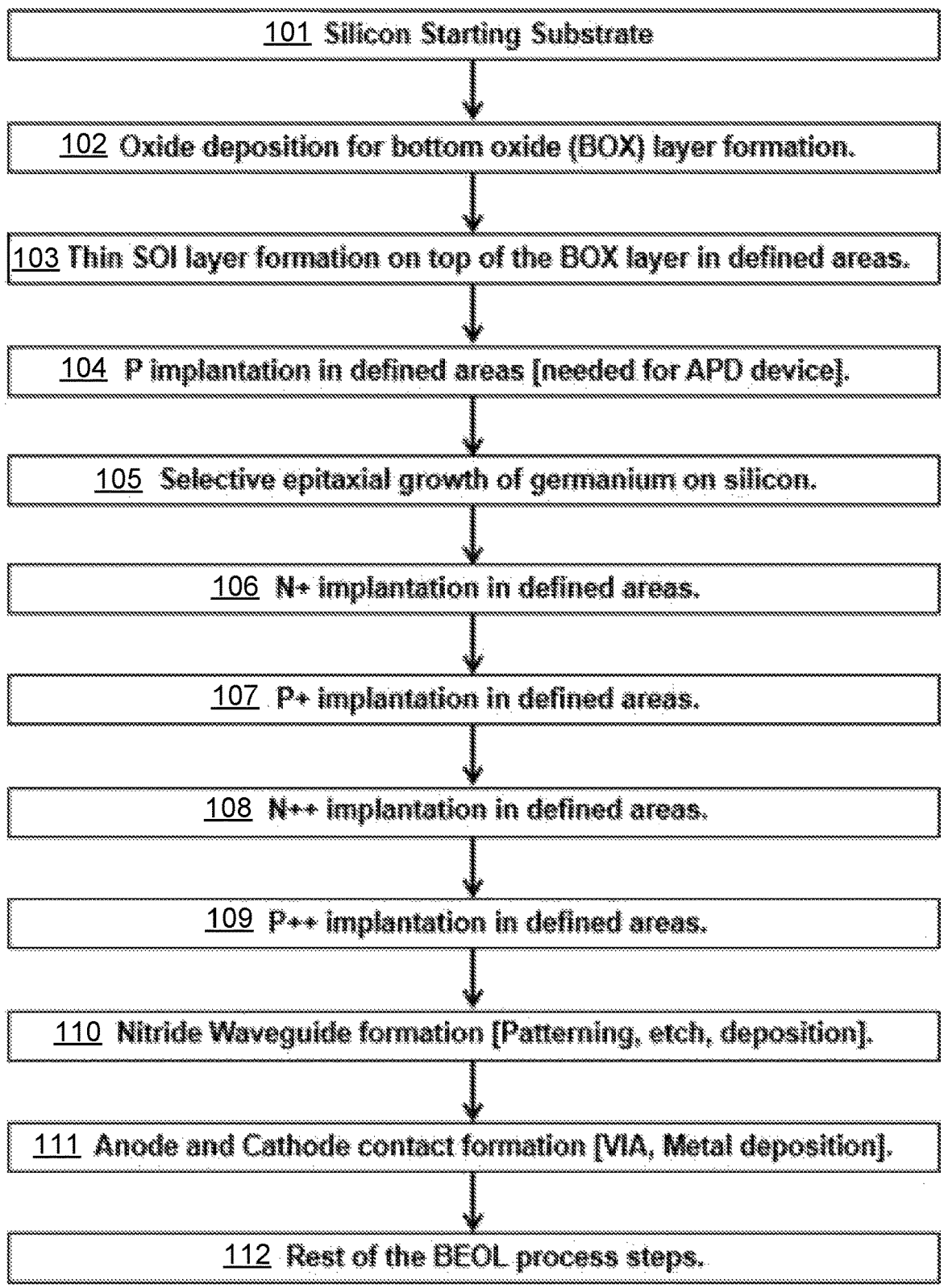
FIG. 4 is a flowchart showing a method of fabricating a photodetector according to an exemplary embodiment of the present technology.

FIG. 4 is a flowchart showing an exemplary method 100 of fabricating the photodiode devices 10 according to embodiments of the present technology leveraging commercial 200 nm or 300 mm immersive lithography and optical proximity correction ("OPC") for optimized device performance across a wide range of device structures. In step 101, the silicon substrate 12 is provided. In step 102, silicon dioxide is deposited on top of the silicon substrate to form the BOX 14. In step 103, a thin silicon layer is formed on top of the BOX 14 to form the SOI 16. In step 105, germanium is grown selectively on the SOI 16 to form the germanium absorption region 20, followed by the required N type and P type implants in the designated areas using ion implantation and/or diffusion process (steps 106-109). In embodiments utilizing the SACM APD 10, the P type doped charge region 70 implantation is done at step 104, prior to the germanium growth. In step 110, the nitride waveguide 30 is fabricated after the implantations are done for the photodiode 10 using the patterning, etching, and deposition processes described above. In step 111, the anode contacts 56 and the cathode contacts 46 are formed via, for example, metal deposition. In step 112, the rest of the standard back end of line ("BEOL") processes are performed to form contacts and device protective layers.

EXAMPLES

In an exemplary embodiment, a rigorous simulation was performed using the TCAD Sentaurus process and device simulation suite to analyze the photodiode 10 performance. Sentaurus Process ("S-process") is used for process simulation and structure generation, and Sentaurus Device ("S-device") is used to perform current-voltage characterization, capacitance-voltage characterization, and optical bandwidth characterization.

Figure 5:
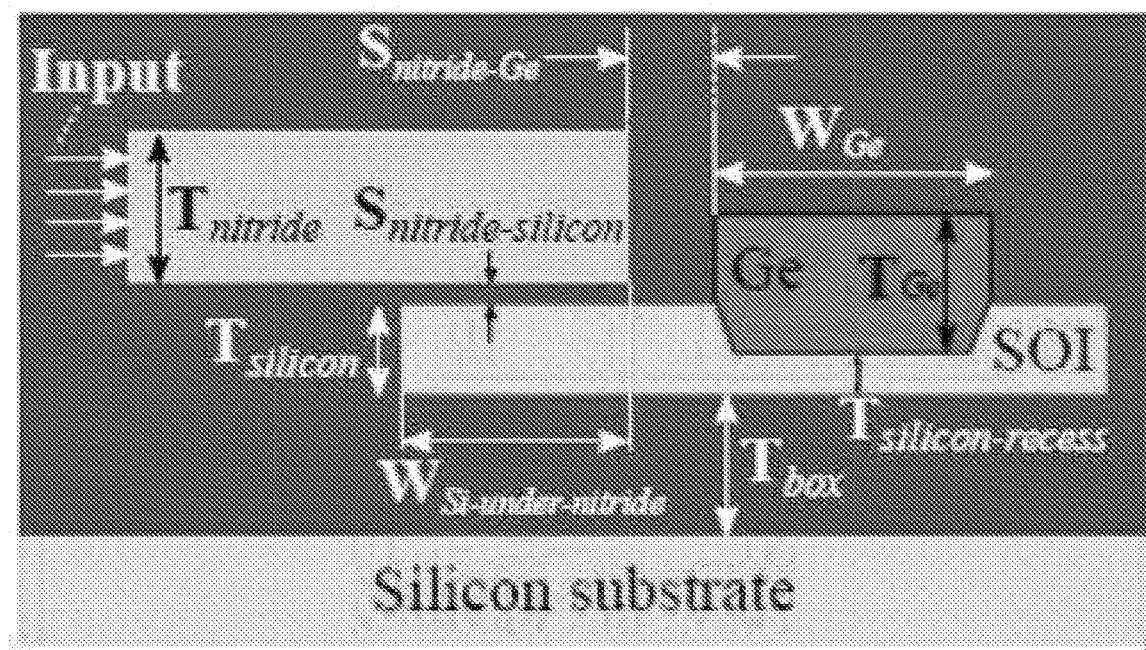
FIG. 5 is a schematic view of an exemplary photodetector structure used in a simulation.
Figure 6A:
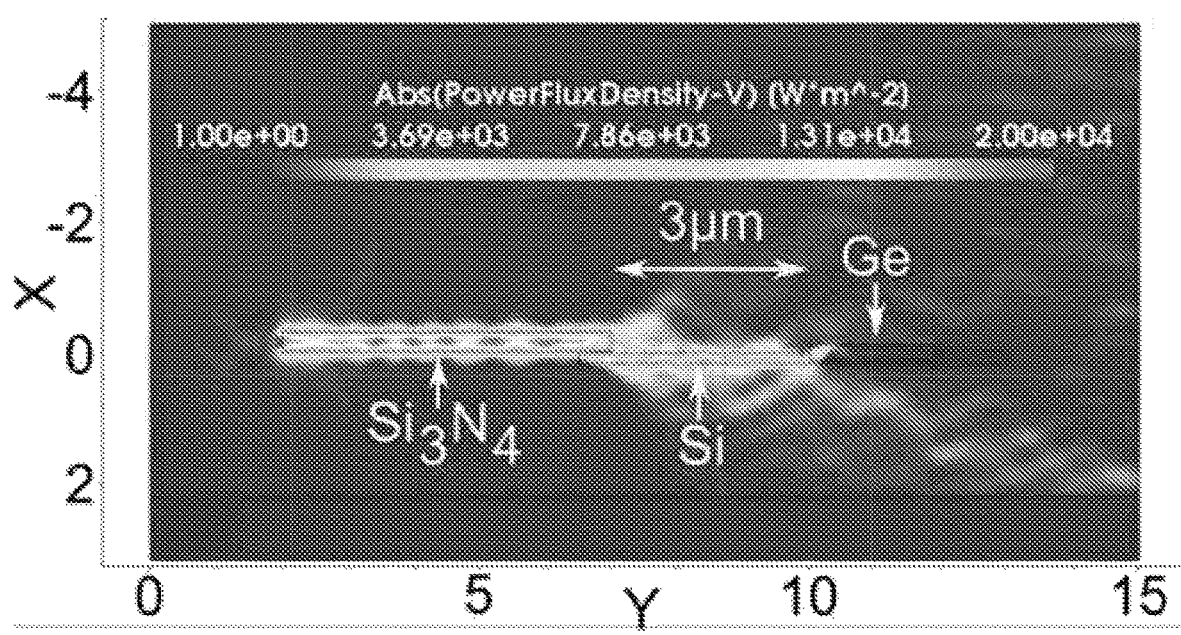
FIGS. 6A-6C are charts showing 2-D power density profiles for three distances between nitride and Ge of 3 μm, 1.5 μm, and 50 nm, respectively.
Figure 6B:
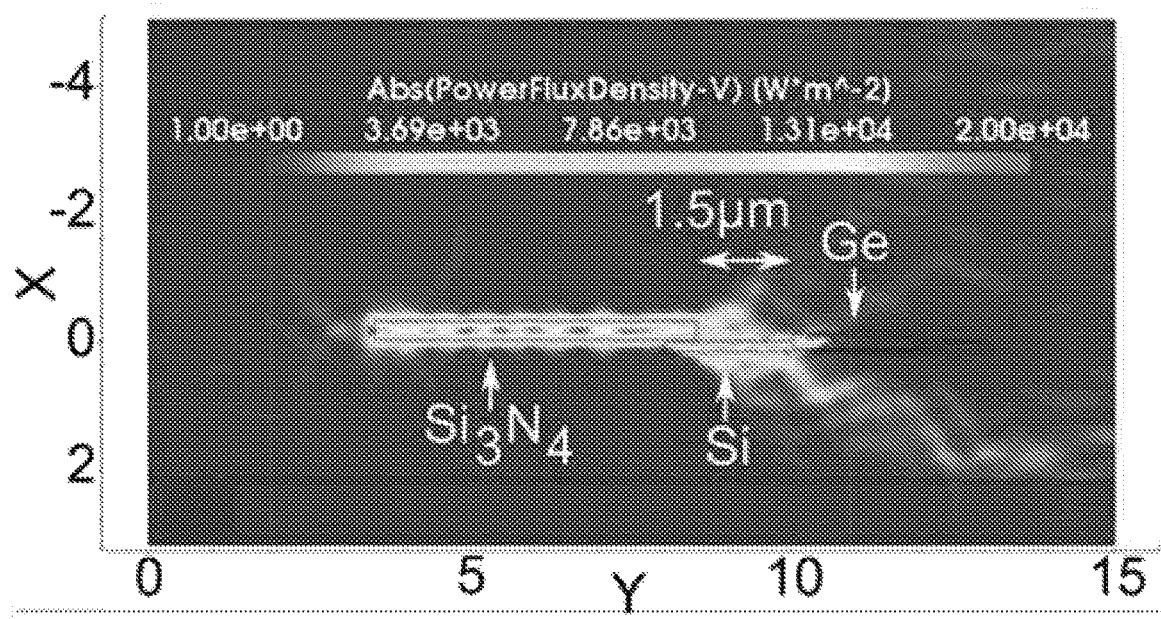
Figure 6C:
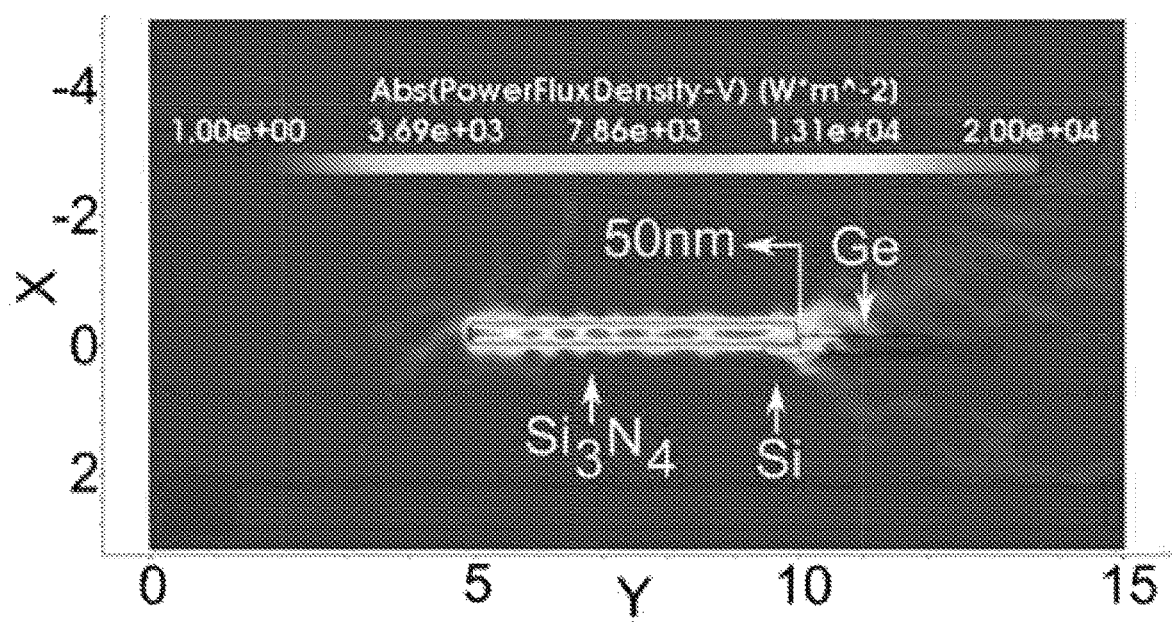
Figure 6D:
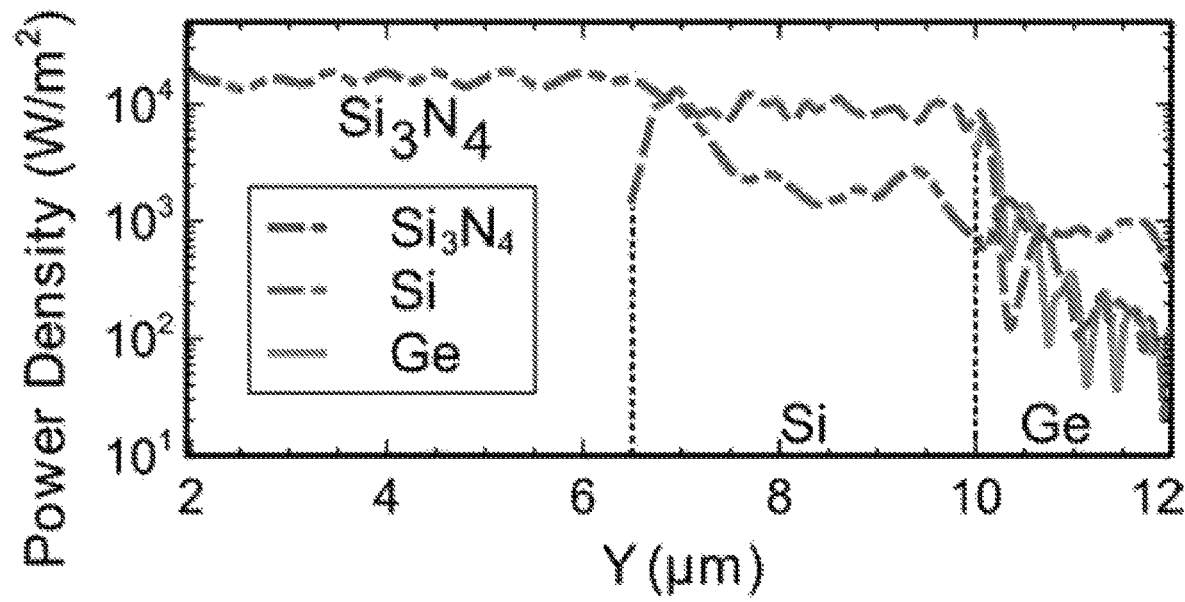
FIGS. 6D-6F are charts showing the power density along the middle of each material region, namely $Si_3N_4$, Si, and Ge along the y-axis, for FIGS. 6A-6C, respectively.
Figure 6E:
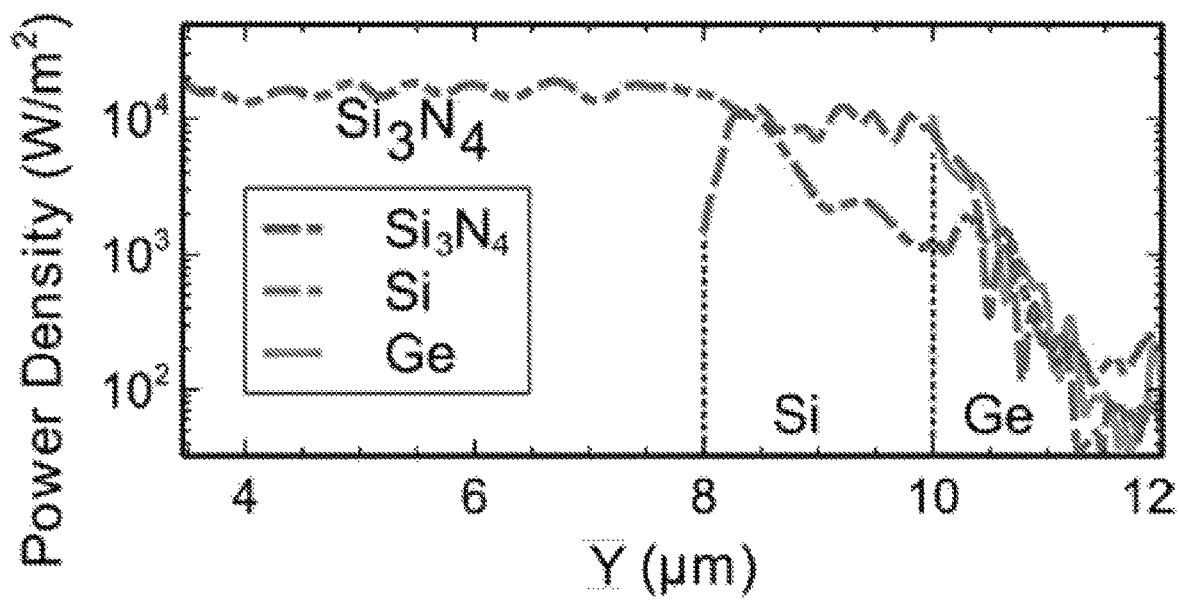
Figure 6F:
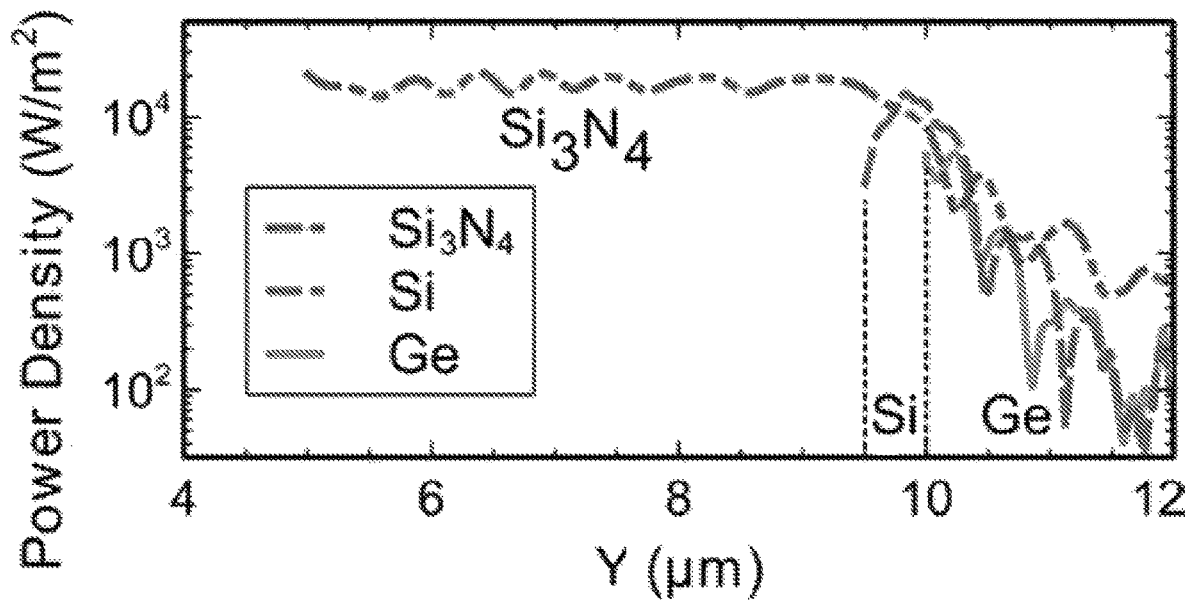
Figure 7:
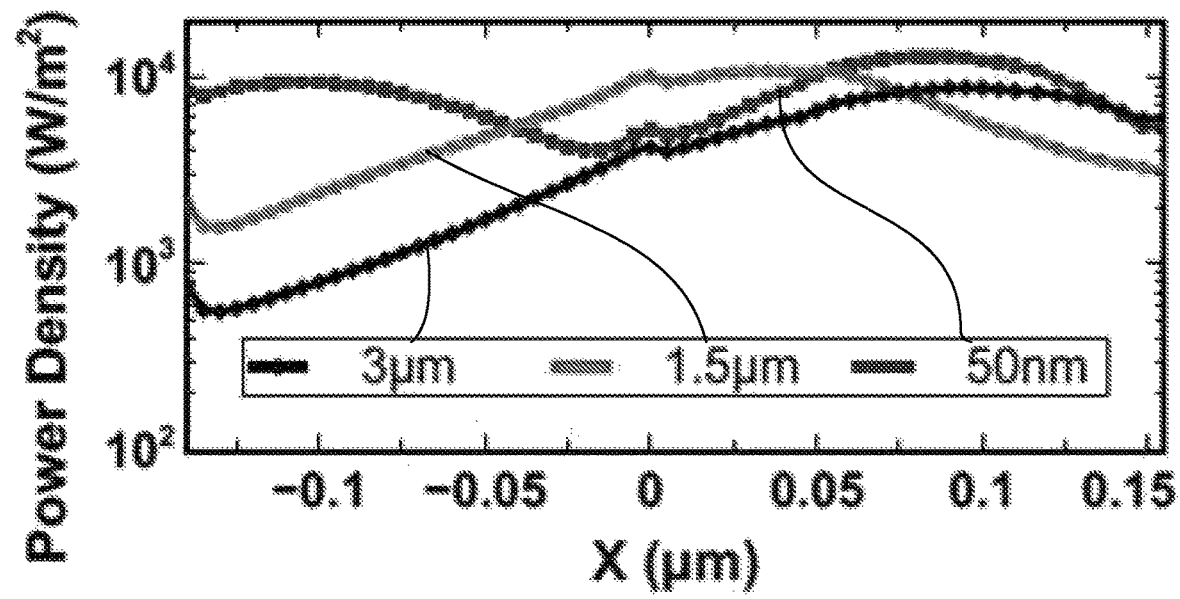
FIG. 7 is a chart showing the power density profile at the input side of the Ge region at y=10 μm along the x-axis of FIGS. 6A-6F.

FIG. 5 describes the photodiode structure used in the simulation. In this embodiment, it was assumed that $T_{nitride}=300$ nm, $T_{silicon}=155$ nm, $T_{Ge}=250$ nm, $T_{silicon-recess}=45$ nm, $T_{box}=2000$ nm, $W_{Ge}=2000$ nm, $W_{Si-under-nitride}=500$ nm, and $S_{nitride-silicon}=25$ nm. The values for $S_{nitride-Ge}$ used were 50 nm, 1500 nm, and 3000 nm. FIGS. 6A-6C show an S-device electromagnetic simulation result of the optical power density profile of a representative nitride waveguide coupled photodetector 10 with three different distances between the nitride waveguide 30 and germanium absorption region 20 of 3 µm, 1.5 µm, and 50 nm. FIGS. 6D-6F show the power density along the middle of each material region, namely $Si_3N_4$, Si, and Ge along the y-axis. For the first two cases, most of the light is coupled from nitride to the underlying silicon layer, and after traveling for a brief distance is absorbed by the germanium. Consequently, only 28% and 32% of the incoming light from the nitride waveguide is absorbed in the Ge for these two cases, respectively. For the third case, however, the distance between nitride and germanium is only 50 nm, which facilitates direct coupling of light from Nitride to Germanium, resulting in a coupling efficiency of 52%. FIG. 7 shows the power density profile at the input side of the Germanium region at y=10 µm along the x-axis in FIGS. 6A-6F. The two peaks for the 50 nm case demonstrate light coupling into the germanium from the top (Nitride) as well as bottom (Si).

Figure 8A:
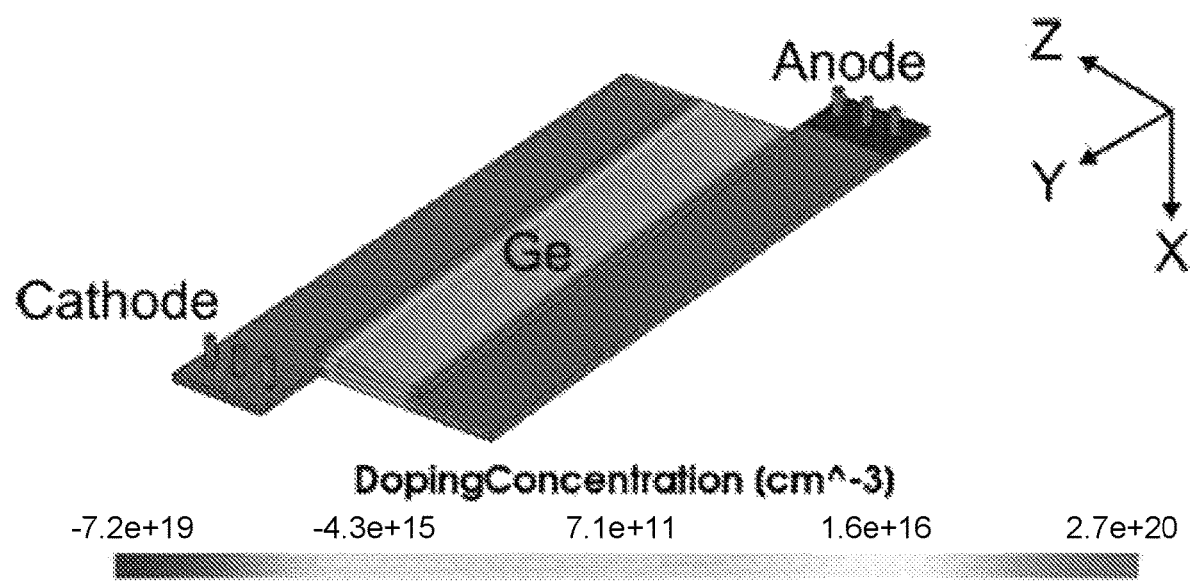
FIGS. 8A-8B are perspective views of exemplary embodiments of the PIN photodiode and the APD, respectively.
Figure 8B:
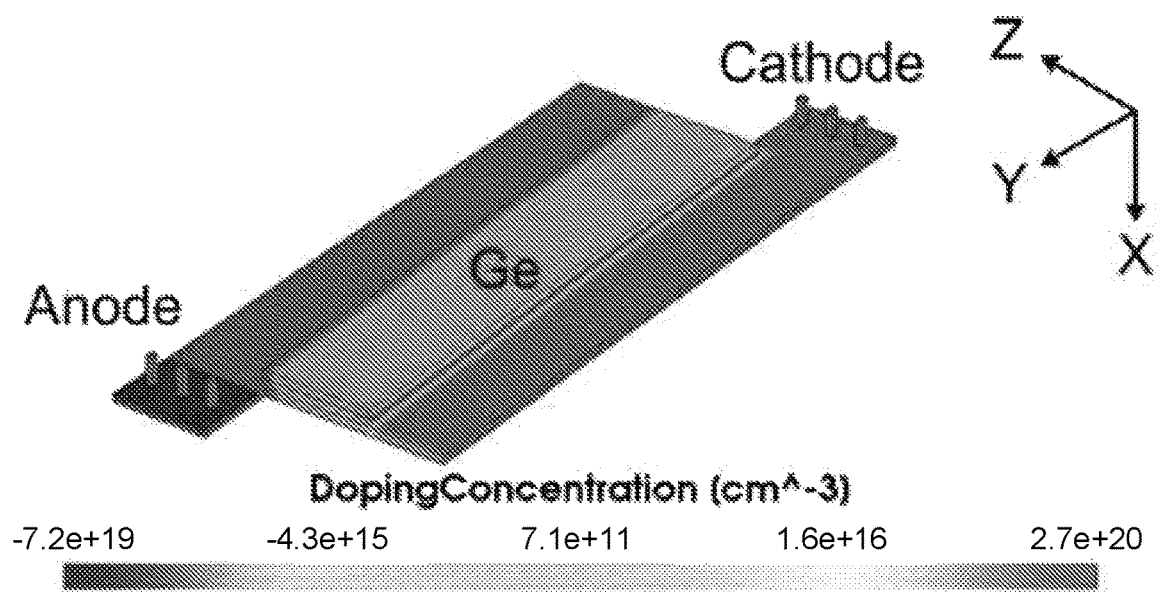
Figure 8C:
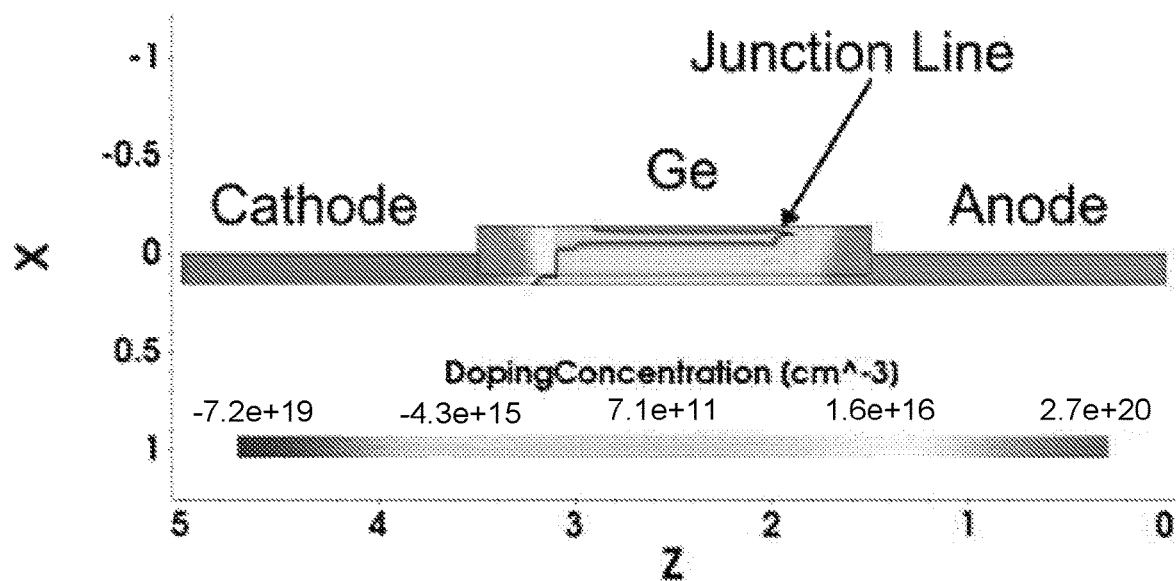
FIGS. 8C-8D are cross-section views of doping profiles of the PIN photodiode and APD of FIGS. 8A-8B, respectively.
Figure 8D:
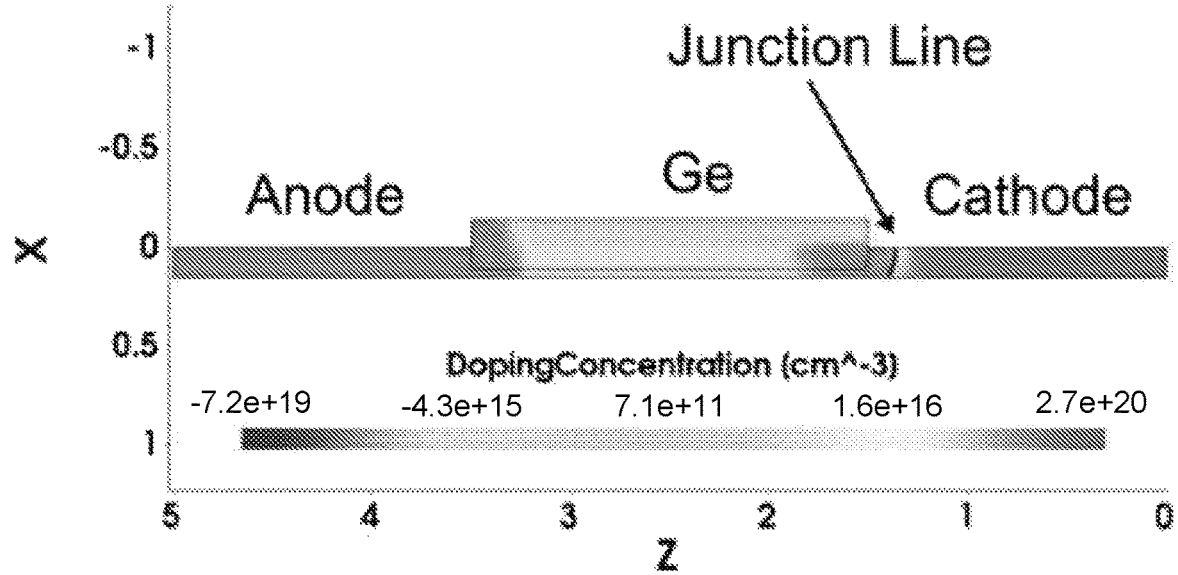

FIGS. 8A and 8B show perspective views of the PIN photodiode and the APD doping profile, respectively, and FIGS. 8C and 8D show cross-section views of the PIN photodiode and APD doping profile, respectively. FIG. 8A shows an embodiment of the doping profile of the PIN photodiode. Here, the nitride waveguide section is not shown for the sake of clarity. The direction of the input optical signal from the nitride waveguide is in the positive Z-direction. For this structure, the anode is under the nitride waveguide. Due to the symmetry of the device, the opposite arrangement is also possible without any difference in performance. FIG. 8C is the cross-section at the midpoint of the device as shown in FIG. 8A. The grey line marks the junction in FIG. 8C. The peak doping density at the anode region is $7.2 \times 10^{19}$ cm$^{-3}$ and at the cathode region is $2.7 \times 10^{20}$ cm$^{-3}$. The intrinsic region width for this device is about 1.81 µm.

Figure 8E:
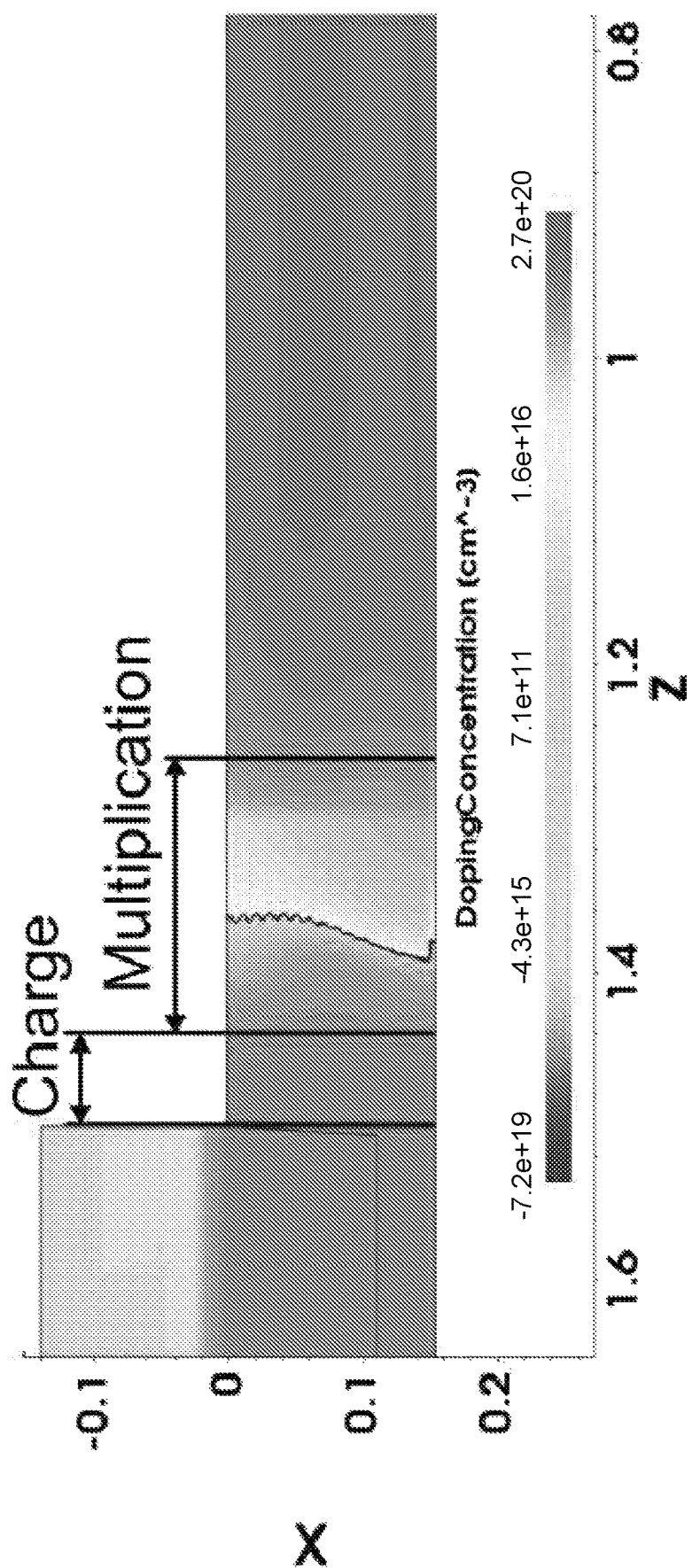
FIG. 8E is an enlarged view of the charge and multiplication region of the APD doping profile of FIG. 8D.

FIG. 8B shows an embodiment of the doping profile of the SACM APD. The light coupling scheme is like the PIN photodiode. However, the cathode is under the nitride waveguide, unlike the PIN photodiode, because the high concentration of the photo-generated carriers will be close to the charge and multiplication region, as shown in FIG. 8E. The peak doping density at the anode and cathode region is like the PIN photodiode. The doping density at the charge region is in the range of $1\times10^{17}$ cm$^{-3}$ to $1\times10^{18}$ cm$^{-3}$. The area in the SOI with light p-type boron-doped ($5\times10^{15}$ cm$^{-3}$) forms the multiplication region of the device.

Figure 9A:
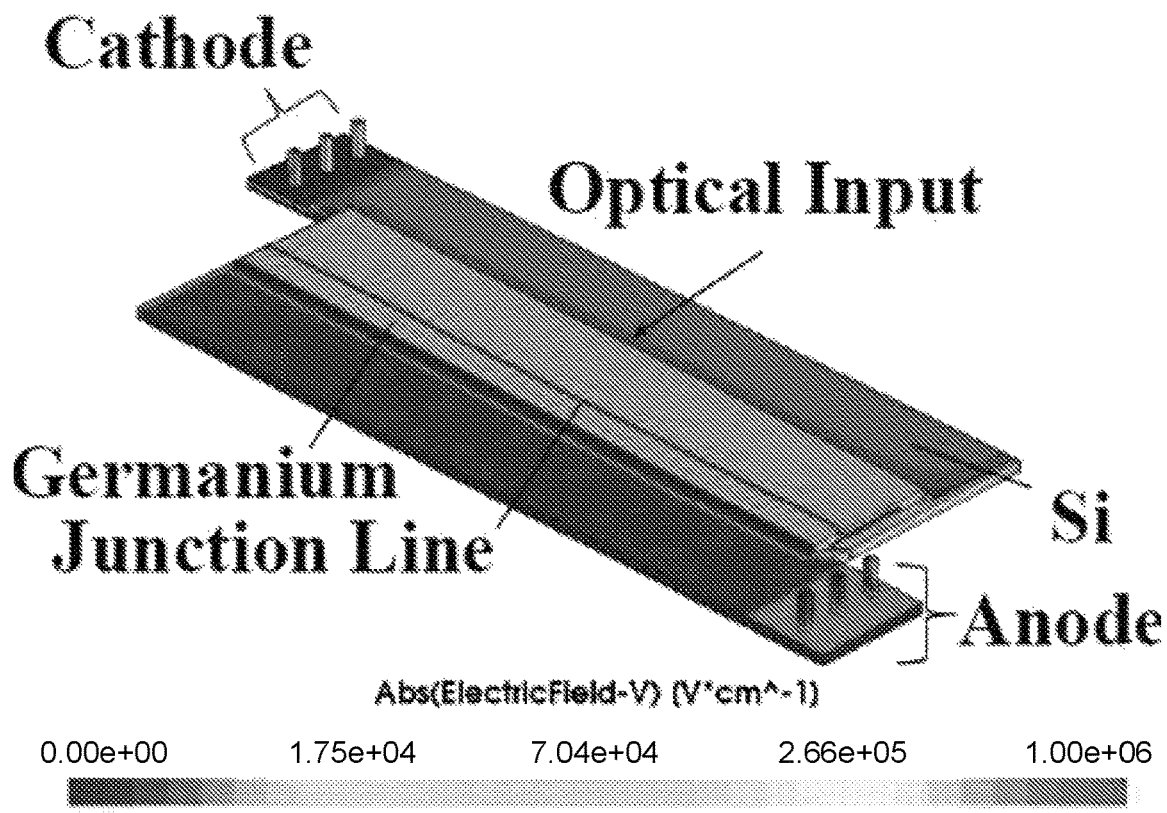
FIGS. 9A-9B are perspective views of exemplary embodiments of the PIN photodiode and the APD, respectively.
Figure 9B:
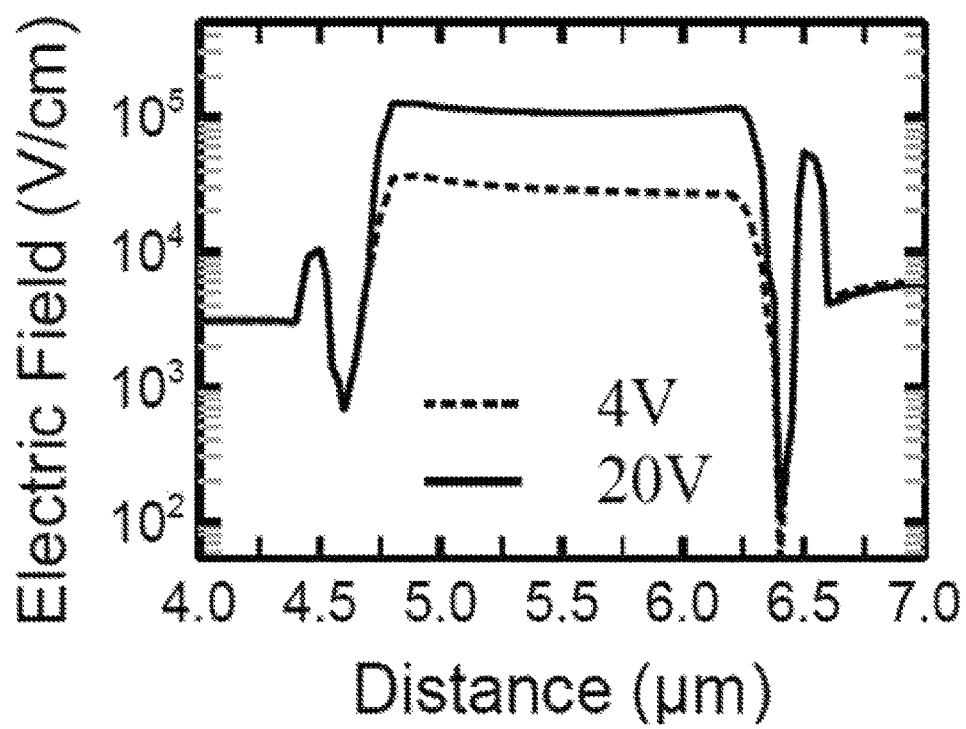
Figure 9C:
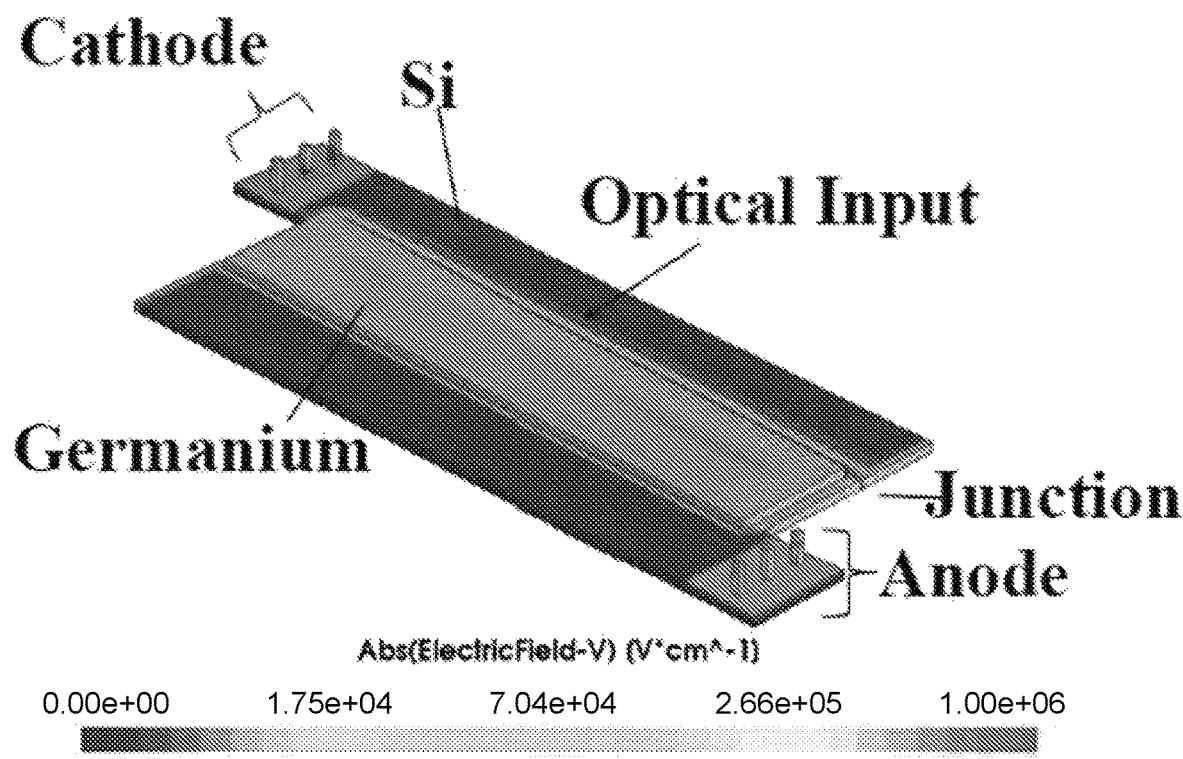
FIGS. 9C-9D are charts showing the electric field profiles of the PIN photodiode and the APD of FIGS. 9A-9B.

FIG. 9B shows a 1-d electric field profile of a nitride waveguide butt coupled PIN photodetector at 4V and 20V applied reverse bias voltage across the midpoint in FIG. 9A. For a low reverse bias voltage of 4V, the electric field in germanium intrinsic region is about $3\times10^4$ V cm$^{-1}$ whereas, for 20V it is about $1\times10^5$ V cm$^{-1}$. As the electric field is below or equal to the critical electric field for germanium, the PIN photodiode does not exhibit any avalanche multiplication for a voltage up to 20V.

Figure 9D:
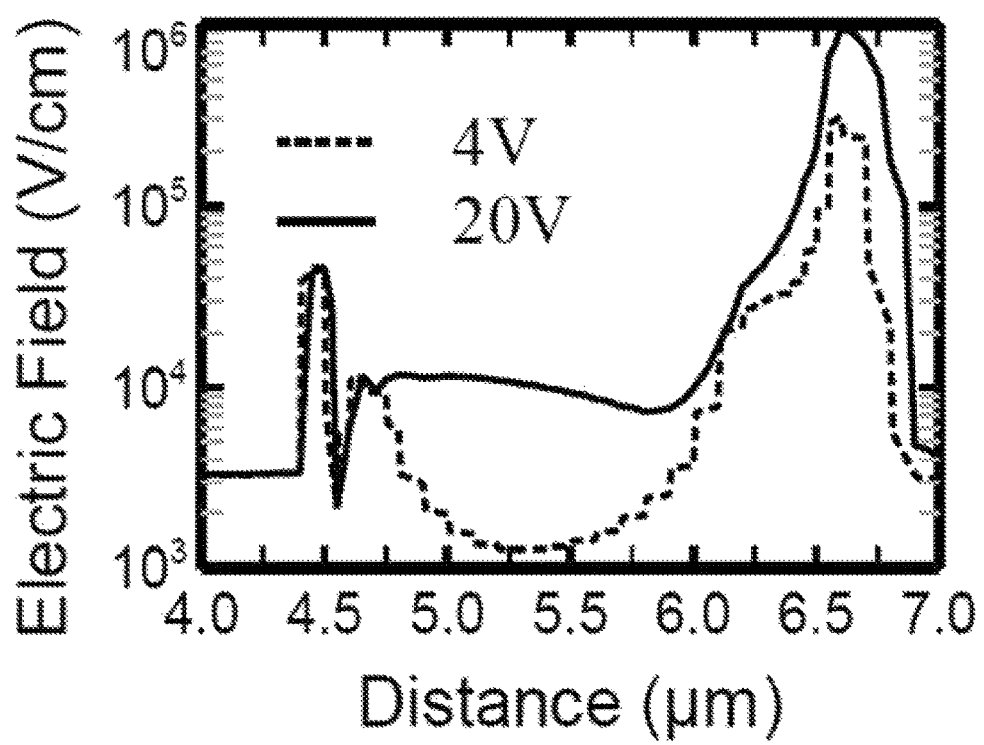

FIG. 9D shows a 1-d electric field profile of a nitride waveguide butt coupled SACM APD at 4V and 20V applied reverse bias voltage across the midpoint in FIG. 9B. For a low reverse bias voltage of 4V, the electric field in germanium absorption region is about $1\times10^3$ V cm$^{-1}$ whereas, for 20V it is about $1\times10^4$ V cm$^{-1}$, which is the electric field required for saturation velocity in germanium. The electric field between 6.5 to 7 μm is close to $1\times10^6$ V cm$^{-1}$ for 20V in the silicon multiplication region, which is greater than the silicon critical electric field for avalanche process. Because of this, the SACM APD exhibits avalanche multiplication for a voltage greater than 5V.

Figure 10A:
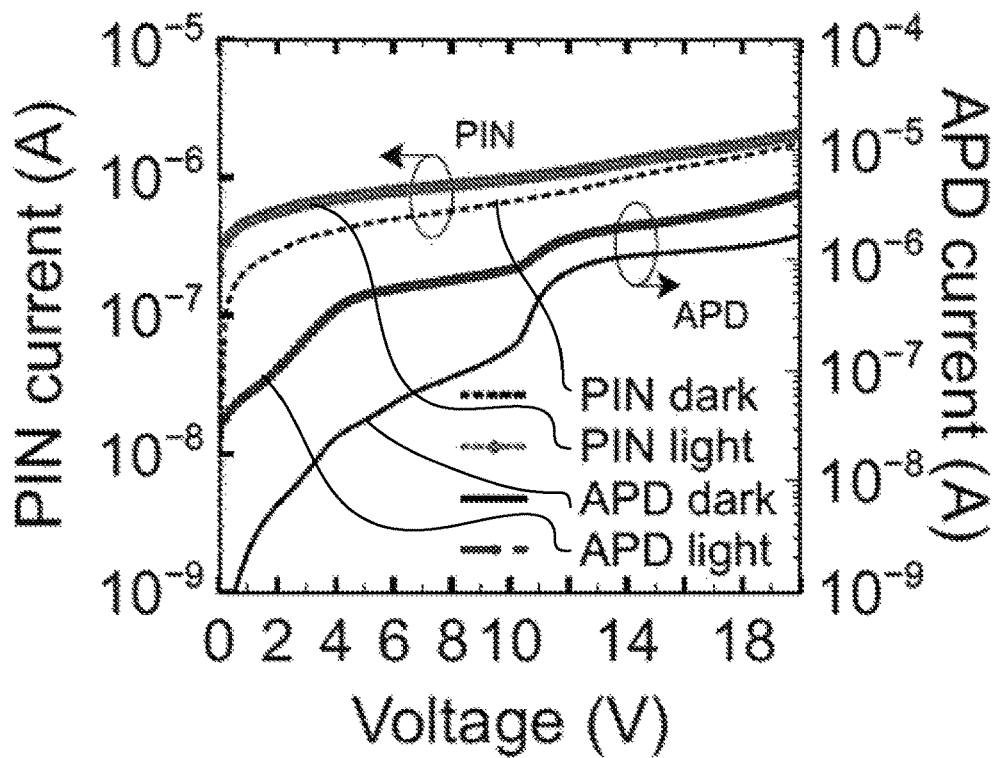
FIG. 10A is a chart showing light and dark I-V curves for exemplary embodiments of the PIN photodiode and APD.
Figure 10B:
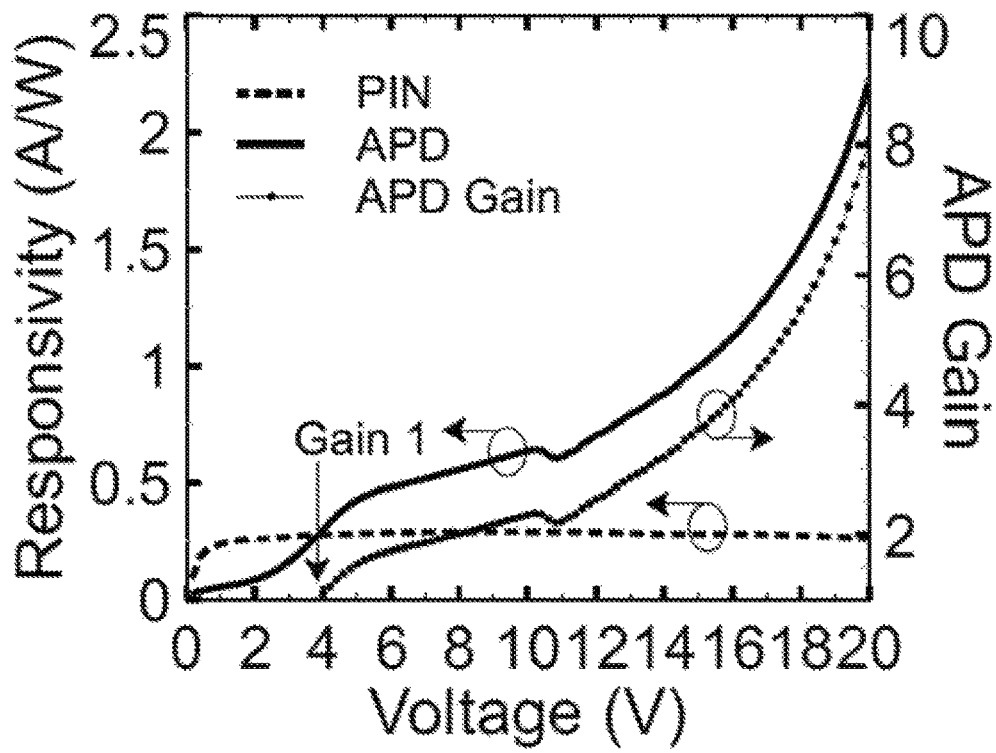
FIG. 10B is a chart showing responsivity and gain of the PIN photodiode and APD of FIG. 10A.

FIG. 10A shows a plot comparing the current versus voltage characteristics of the nitride waveguide coupled PIN and SACM APD, respectively. Notably, the PIN photodiode exhibits 4× higher dark current compared to the SACM APD at 10 V reverse bias voltage. Between 10 V and 12 V, there is a sudden increase in dark current in the SACM APD due to the punch-through effect. FIG. 10B shows the responsivity of PIN and SACM APD for 940 nm wavelength input with 1 μW input power. Assuming the gain of PIN APD to be 1, unity gain responsivity for the PIN photodiode under consideration is found to be 0.28 A/W. The responsivity of the SACM APD reaches 0.28 A/W at 4 V reverse bias. The responsivity keeps increasing for the SACM APD after that due to the avalanche effect. At a reverse bias voltage of 20 V, the gain of the SACM APD reaches a value of 8.

Figure 11A:
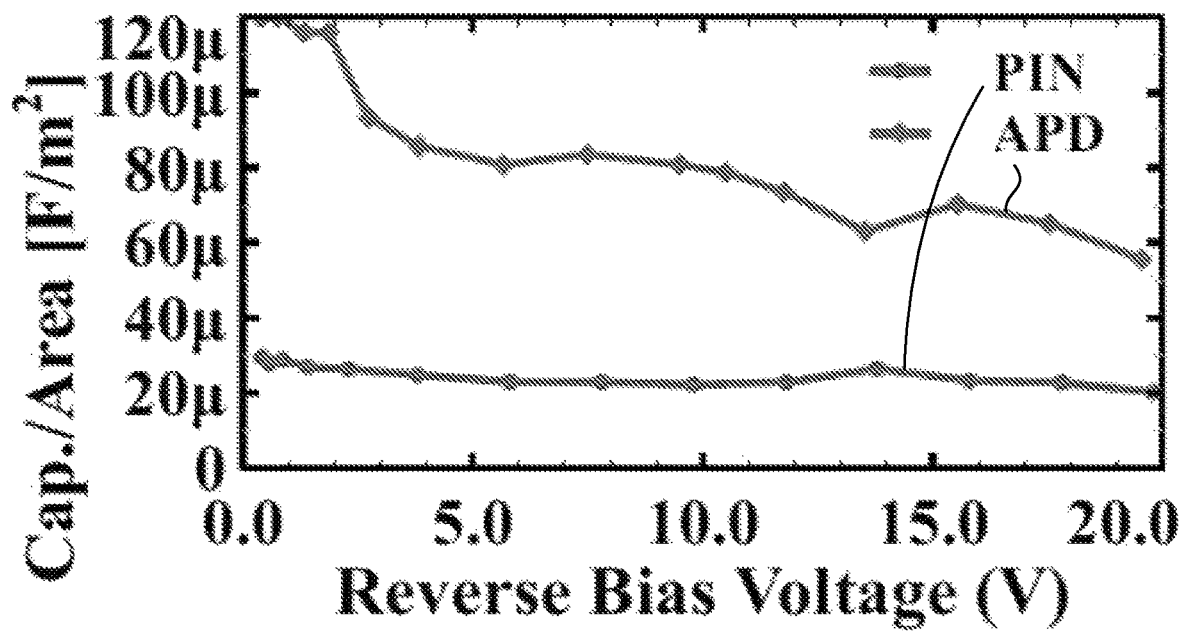
FIG. 11A is a chart showing C-V curves for exemplary embodiments of the PIN photodiode and APD.

FIG. 11A shows a plot comparing the capacitance/area of the PIN photodiode and the SACM APD versus the applied reverse bias voltage. Three points are noticeable from this figure. First, the PIN photodiode exhibits a fixed capacitance with increasing reverse bias voltage, implying an unchanged depletion region width. Second, the APD capacitance reduces with the reverse bias voltage, which means the depletion region width mainly formed by the multiplication region, charge region, and absorption region is changing with voltage. Finally, the APD capacitance per unit area is higher compared to the PIN photodiode, which indicates that the overall depletion region width of the APD is lower compared to the PIN APD at least up to 20V.

Figure 11B:
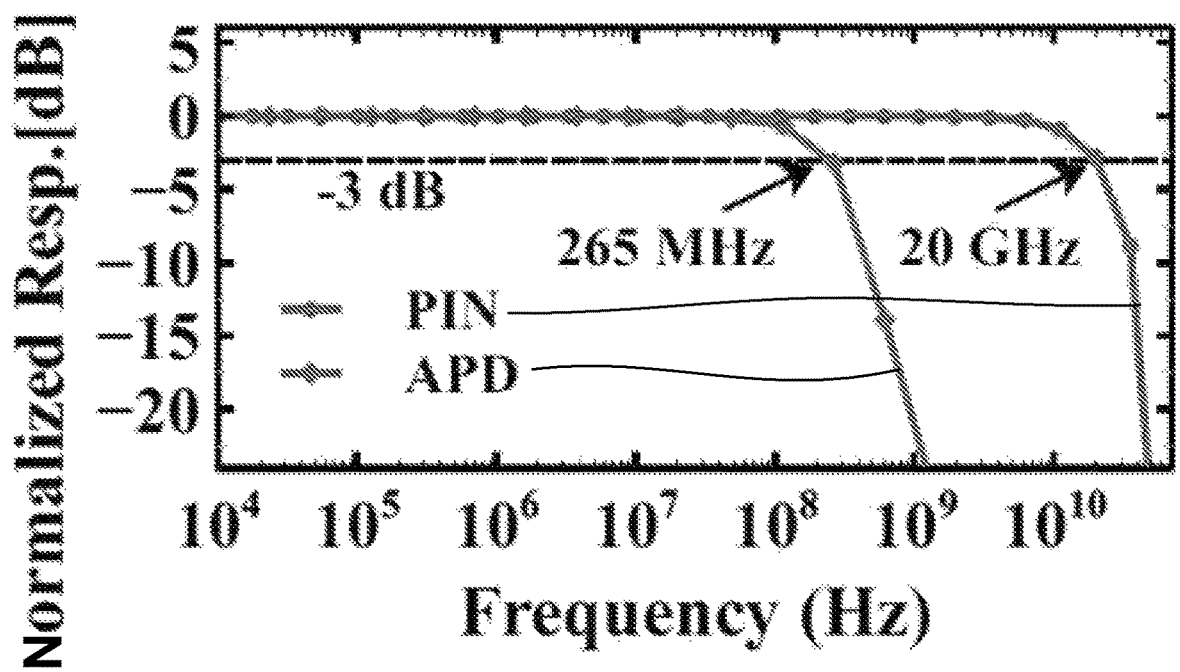
FIG. 11B is a chart showing optical bandwidth of the PIN photodiode and APD of FIG. 11A.

FIG. 11B shows a plot comparing the normalized optoelectric response to the PIN photodiode and the SACM APD with respect to frequency. The PIN photodiode exhibits a −3 dB bandwidth of 20 GHz, whereas the SACM APD exhibits a bandwidth of only 265 MHz at 10 V reverse bias. For the PIN photodiode, the germanium region is fully depleted, and it has a high electric field, as shown in FIG. 9B. For the SACM APD, the germanium region has an electric field lower than $10^4$ V cm$^{-1}$ below 20 V. The bandwidth can be increased by increasing the reverse bias voltage for the SACM APD to 20 V. The transit time-limited bandwidth of the PIN photodetector is given by the following equation:

$$f_{transit} = \frac{0.44 v_{sat}}{W_{ge,effective}} \quad (2)$$

where, $v_{sat}=6\times10^6$ cm/s is the saturation velocity in Ge and $W_{ge,effective}$ is the effective intrinsic width of Ge which takes into account the i-Ge width reduction due to thermal annealing for dopant activation. A simulated bandwidth of 20 GHz suggests the effective intrinsic region width is 1.3 μm for the simulated nitride coupled PIN Ge-on-Si photodetector which is less than the drawn intrinsic width of 1.8 μm.

Accordingly, embodiments of the present technology are directed to silicon nitride waveguide coupled Ge-on-Si photodetectors for the 850 nm to 940 nm wavelength range. A comparison of two exemplary devices is summarized in Table 1 below. Rigorous simulation was performed to analyze and characterize the PIN and SACM avalanche photodetectors at 940 nm. The exemplary PIN photodetector achieved a responsivity of 0.3 A/W, whereas the exemplary SACM APD achieved a responsivity of 0.63 A/W at 10 V. It demonstrates a gain value of 2.1 at 10 V for the APD. The further simulation revealed the APD achieves a gain of 8 at 20 V. The breakdown voltage for the APD and the PIN photodiode is about 23 V and 28 V, respectively. At 10 V reverse bias, the PIN photodiode achieves a −3 dB bandwidth of 20 GHz, and the SACM APD could achieve a bandwidth of 265 MHz. Due to the electric field distribution, the APD bandwidth is carrier diffusion limited. By increasing the voltage to 20 V, the APD bandwidth can be increased. Three different distances were considered for the nitride waveguide to germanium separation. Coupling efficiency between nitride and germanium sidewall is between 50-60%.

TABLE 1

| Simulated performance summary of exemplary photodetectors | | |
|---|---|---|
| Structure | PIN | SACM APD |
| Wavelength (nm) | 940 | 940 |
| Responsivity (A/W) | 0.265 | 0.63 |
| Gain | — | 8 |
| Bandwidth (GHz) | 20 | 0.265 |
| Capacitance (F/m$^2$) | 2e−5 | 8e−5 |

Although the technology has been described and illustrated with respect to exemplary embodiments thereof, it should be understood by those skilled in the art that the foregoing and various other changes, omissions, and additions may be made therein and thereto, without parting from the spirit and scope of the present technology.

What is claimed is:

1. A photodiode structure comprising:
   a silicon substrate;
   an oxide layer on the silicon substrate;
   a silicon on insulator region on the oxide layer;
   a germanium absorption region at least partially disposed in a recess of the silicon on insulator region, the germanium absorption region comprising a top surface having a first width and a bottom surface having a second width, the first width being greater than the second width;
   a cathode region formed at a first side of the germanium absorption region;

an anode region formed at a second side of the germanium absorption region opposite the first side; and a silicon nitride waveguide positioned adjacent the first side of the germanium absorption region over the cathode region or adjacent the second side of the germanium absorption region over the anode region.

2. The photodiode structure of claim 1, wherein the germanium absorption region further comprises a bottom portion that conforms in shape to a shape of the recess of the silicon on insulator region.

3. The photodiode structure of claim 2, wherein the bottom portion of the germanium absorption region has trapezoidal cross-section, and the germanium absorption regions further comprises a top portion having a rectangular cross-section.

4. The photodiode structure of claim 1, wherein the anode region, the cathode region, and the germanium absorption region form a PIN photodiode.

5. The photodiode structure of claim 1, further comprising a charge region adjacent to the germanium absorption region, and an intrinsic multiplication region adjacent to the charge region such that the cathode region is adjacent to the intrinsic multiplication region.

6. The photodiode structure of claim 5, wherein the anode region, the cathode region, the charge region, the intrinsic multiplication region, and the germanium absorption region form a separate absorption, charge and multiplication avalanche photodiode.

7. The photodiode structure of claim 1, further comprising cathode electrical contacts positioned on an extended silicon on insulator region.

8. The photodiode structure of claim 1, further comprising anode electrical contacts positioned on an extended silicon on insulator region.

9. The photodiode structure of claim 1, further comprising N type doping positioned under the silicon nitride waveguide.

10. The photodiode structure of claim 1, further comprising P type doping positioned under the silicon nitride waveguide.

11. The photodiode structure of claim 1, further comprising a metal reflector positioned above the germanium absorption region to enhance light coupling efficiency.

12. A method of forming a photodiode, comprising the steps of:
    providing a silicon substrate;
    depositing silicon dioxide on the silicon substrate to form a bottom oxide layer;
    forming a thin silicon on insulator layer on a portion of the bottom oxide layer;
    epitaxially growing a germanium absorption region on the silicon on insulator layer such that the germanium absorption region is at least partially disposed in a recess of the silicon on insulator layer, the germanium absorption region comprising a top surface having a first width and a bottom surface having a second width, the first width being greater than the second width;
    implanting N type doped regions in the bottom oxide layer adjacent a first side of the germanium absorption region;
    implanting P type doped regions in the bottom oxide layers adjacent a second side of the germanium absorption region;
    fabricating a nitride waveguide adjacent the first side of the germanium absorption region over the N type doped regions or adjacent the second side of the germanium absorption region over the P type doped regions; and
    forming anode and cathode contacts.

13. The method of claim 12, wherein the germanium absorption region further comprises a bottom portion that conforms in shape to a shape of the recess of the silicon on insulator region.

14. The method of claim 13, wherein the bottom portion of the germanium absorption region has trapezoidal cross-section, and the germanium absorption regions further comprises a top portion having a rectangular cross-section.

15. The method of claim 12, wherein before the step of epitaxially growing, further comprising the steps of:
    forming a charge region adjacent to the silicon on insulator layer; and
    forming an intrinsic multiplication region adjacent to the charge region such that the charge region is located between the intrinsic multiplication region and the silicon on insulator layer.

16. The method of claim 12, wherein the step of implanting N type doped regions comprises:
    implanting an N+ type doped region in the bottom oxide layer adjacent a first side of the germanium absorption region; and
    implanting an N++ type doped region in the bottom oxide layer adjacent an end of the N+ type doped region;
    wherein the N+ type doped region has a length greater than a length of the germanium absorption region and is positioned such that the N++ type doped region is offset from a first end of the germanium absorption region.

17. The method of claim 16, wherein the step of implanting P type doped regions comprises:
    implanting a P+ type doped region in the bottom oxide layer adjacent a second side of the germanium absorption region; and
    implanting a P++ type doped region in the bottom oxide layer adjacent an end of the P+ type doped region;
    wherein the P+ type doped region has a length greater than a length of the germanium absorption region and is positioned such that the P++ type doped region is offset from a second end of the germanium absorption region.

18. The method of claim 17, wherein the anode contacts are formed in the P++ type doped region and the cathode contacts are formed in the N++ type doped region.

19. The method of claim 12, wherein the nitride waveguide is fabricated via selective etching and either plasma enhanced chemical vapor deposition or low-pressure chemical vapor deposition.

20. The method of claim 12, further comprising providing a metal reflector positioned above the germanium absorption region to enhance light coupling efficiency.

* * * * *